US010377923B2

(12) United States Patent
Ichioka et al.

(10) Patent No.: US 10,377,923 B2
(45) Date of Patent: Aug. 13, 2019

(54) SURFACE PROTECTIVE FILM, MAKING METHOD, AND SUBSTRATE PROCESSING LAMINATE

(71) Applicant: Shin-Etsu Chemical Co., Ltd., Tokyo (JP)

(72) Inventors: Yoichiro Ichioka, Annaka (JP); Kazunori Kondo, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 254 days.

(21) Appl. No.: 15/423,948

(22) Filed: Feb. 3, 2017

(65) Prior Publication Data

US 2017/0226386 A1 Aug. 10, 2017

(30) Foreign Application Priority Data

Feb. 4, 2016 (JP) ................................ 2016-019725

(51) Int. Cl.

| | |
|---|---|
| ***C08G 61/02*** | (2006.01) |
| ***C09J 7/02*** | (2006.01) |
| ***C08G 77/00*** | (2006.01) |
| ***C09J 5/06*** | (2006.01) |
| ***B32B 27/28*** | (2006.01) |
| ***B32B 7/12*** | (2006.01) |
| ***H01L 21/56*** | (2006.01) |
| *C09J 165/00* | (2006.01) |
| *C09J 183/06* | (2006.01) |
| *C09J 11/08* | (2006.01) |

(52) U.S. Cl.

CPC ............... *C09J 7/0282* (2013.01); *B32B 7/12* (2013.01); *B32B 27/283* (2013.01); *C08G 61/02* (2013.01); *C08G 77/80* (2013.01); *C09J 5/06* (2013.01); *H01L 21/56* (2013.01); *C08G 2261/122* (2013.01); *C08G 2261/1424* (2013.01); *C08G 2261/3424* (2013.01); *C08J 2379/08* (2013.01); *C08J 2465/00* (2013.01); *C08J 2483/06* (2013.01); *C09J 11/08* (2013.01); *C09J 165/00* (2013.01); *C09J 183/06* (2013.01); *C09J 2479/086* (2013.01); *C09J 2483/00* (2013.01)

(58) Field of Classification Search

CPC ...... C09J 5/06; C09J 2483/00; C09J 2483/06; C09J 11/08; C09J 183/06; C09J 165/00; C09J 2465/00; C09J 2379/08; C09J 2479/086; C08G 77/80; C08G 61/02; C08G 2261/1424; C08G 2261/3424; C08G 2261/122; H01L 21/56; B32B 7/12; B32B 27/283

See application file for complete search history.

(56) References Cited

U.S. PATENT DOCUMENTS

2012/0213993 A1* 8/2012 Takeda .................. C08G 77/14
428/355 EP

FOREIGN PATENT DOCUMENTS

| | | | |
|---|---|---|---|
| JP | 10-284444 | A | 10/1998 |
| JP | 2013-199623 | A | 10/2013 |
| JP | 2014-17336 | A | 1/2014 |

* cited by examiner

*Primary Examiner* — Robert S Jones

(74) *Attorney, Agent, or Firm* — Westerman, Hattori, Daniels & Adrian, LLP

(57) ABSTRACT

A surface protective film comprising a base film and a resin film thereon can be bonded to a substrate having a circuit-forming surface and separated therefrom after processing. The resin film is formed of a resin composition comprising (A) a silphenylene-siloxane skeleton-containing resin, (B) a compound capable of reacting with an epoxy group in the resin to form a crosslinked structure, (C) a curing catalyst, and (D) a parting agent.

10 Claims, No Drawings

SURFACE PROTECTIVE FILM, MAKING METHOD, AND SUBSTRATE PROCESSING LAMINATE

CROSS-REFERENCE TO RELATED APPLICATION

This non-provisional application claims priority under 35 U.S.C. § 119(a) on Patent Application No. 2016-019725 filed in Japan on Feb. 4, 2016, the entire contents of which are hereby incorporated by reference.

TECHNICAL FIELD

This invention relates to a surface protective material which is useful during processing of a substrate. In conjunction with the handling of a substrate having a surface to be protected including formation of through holes or through electrodes in a substrate and precise processing (e.g., circuit formation) of a substrate, this invention relates to a surface protective film which is temporarily bonded to the substrate surface for protecting the surface from flaws, impacts, stains or the like. It also relates to a substrate processing laminate and a method for preparing the surface protective film.

BACKGROUND ART

The current electronic technology is exploring the stack structure having a plurality of vertically stacked semiconductor members. In conjunction with the stack structure, the process of manufacturing semiconductor chips involves the steps of slicing a high purity silicon single crystal ingot into a wafer, forming a desired circuit pattern on the front surface of the wafer to form an integrated circuit, grinding the back surface of the wafer by means of a grinding machine to a wafer thickness of about 25 to 200 μm, perforating holes through the wafer, forming therein electrodes, known as through-silicon-via (TSV), and connecting TSV electrodes in vertical direction for thereby increasing the degree of integration.

Prior to the utilization of TSV, in the step of forming a circuit on a silicon substrate, it is unnecessary to carefully check whether or not the back surface of the substrate is damaged and contaminated because the circuit is only on the front surface. In the TSV structure wherein circuits are formed and connected on both the front and back surfaces, it becomes necessary to protect one surface when the other surface is processed. The protecting member used in this step is required to have heat resistance, pressure resistance and chemical resistance. It is additionally required that the protecting member can be easily removed at the end of processing.

In this application, bonding force and pressure resistance are critical. Specifically, the protecting member must be bonded to a wafer or substrate without leaving gaps, and have sufficient bonding force and pressure resistance to withstand the subsequent steps. At the end of processing, the protecting member can be smoothly stripped from the wafer or substrate without leaving any resin residues, resin components or additive components on the substrate surface.

Thus far, efforts have been made on the resin compositions and surface protective films for protecting wafer surface. For example, Patent Document 1 discloses a surface protective film intended for wafer back grinding which may be debonded with the aid of UV. Once the film is bonded to the front surface of a wafer, the back surface may be ground while the front surface (e.g., circuit) is protected. UV is irradiated for removal, which means that the stripping step is cumbersome, or an expensive UV irradiation equipment is necessary. The increased expense of the step is detrimental. Patent Document 2 discloses a surface protective tape intended for wafer back grinding which does not use UV for removal. This tape is specialized for front surface protection during back surface grinding. The tape has a strong bonding force so that the tape is not separated even under heavy impacts during the back surface grinding. This in turn means that the tape is difficult to strip, suggesting the risk that the thin wafer can be broken when the tape is stripped therefrom. Since the tape is intended for back surface grinding, the use of a solvent other than water is not expected. If a solvent is used, adhesive components in the tape can be dissolved or altered. There is a possibility that the tape is incidentally or difficultly stripped from the wafer surface. For an application other than the back surface grinding, a protective film for use during etching is disclosed in Patent Document 3. This protective film has chemical resistance during etching. The film includes a thin pressure-sensitive adhesive layer, which is difficult to bury irregularities (e.g., circuits and through-holes) on the substrate surface.

CITATION LIST

Patent Document 1: JP-A 2014-017336

Patent Document 2: JP-A 2013-199623

Patent Document 3: JP-A H10-284444

SUMMARY OF INVENTION

An object of the invention is to provide a surface protective film which may be bonded to a substrate, be resistant to chemicals, heat and pressure used in circuit forming or otherwise processing of the substrate, and be stripped from the substrate at the end of processing without a need for UV irradiation or the like and without leaving residues; a substrate processing laminate using the same; and a method for preparing the same.

The inventors have found that a curable resin composition comprising a resin having a silphenylene-siloxane skeleton has high heat resistance, high pressure resistance, high chemical resistance and moderate bonding force, and that the resin composition forms a surface protective film which may be bonded to a substrate and is optimum during handling and processing of the substrate.

Accordingly, in one aspect, the invention provides a surface protective film comprising a base film and a resin film formed thereon, said resin film being formed of a resin composition comprising components (A) to (D):

(A) a silphenylene-siloxane skeleton-containing resin represented by the formula (1) and having a weight average molecular weight of 10,000 to 100,000, (B) a compound capable of reacting with an epoxy group in the silphenylene-siloxane skeleton-containing resin to form a crosslinked structure, (C) a curing catalyst, and (D) a parting agent selected from the group consisting of polyethylenes, silicone compounds, fluorine compounds, fatty acids, and fatty acid esters, in an amount of 0.5 to 20 parts by weight per 100 parts by weight of component (A).

(1)

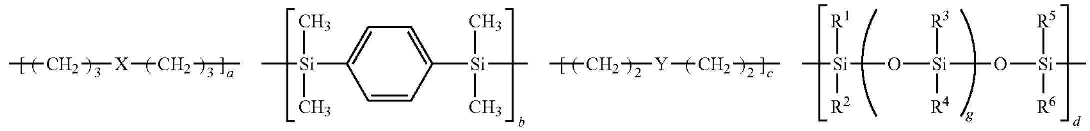

Herein $R^1$ to $R^6$ are each independently a $C_1$-$C_{20}$ monovalent hydrocarbon group or alkoxy group; a, b, c, and d, indicative of compositional ratios of corresponding repeating units, are positive numbers satisfying: $0<a<1$, $0<b<1$, $0\leq c<1$, $0<d<1$, $0.35\leq a+c\leq 0.65$, $0.35\leq b+d\leq 0.65$, and $a+b+c+d=1$, g is an integer of 0 to 300; X is a divalent organic group having the formula (2):

(2)

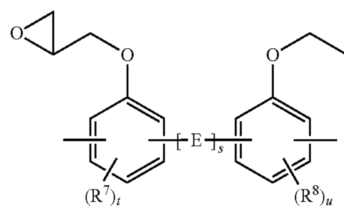

wherein E is a divalent organic group selected from the following:

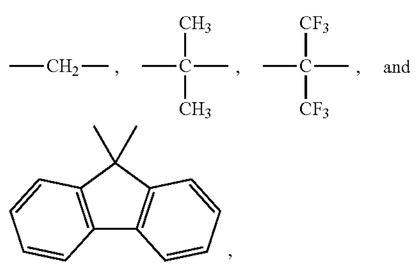

s is 0 or 1, $R^7$ and $R^8$ are each independently a $C_1$-$C_{20}$ monovalent hydrocarbon group or alkoxy group, t and u are each independently an integer of 0 to 2; and Y is a divalent siloxane chain having the formula (3):

(3)

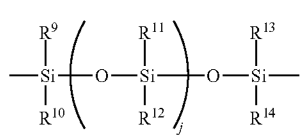

wherein $R^9$ to $R^{14}$ are each independently a $C_1$-$C_{20}$ monovalent hydrocarbon group or alkoxy group, and j is an integer of 0 to 300.

Preferably, in formula (1), a, b, c and d satisfy $a+c=0.5$ and $b+d=0.5$.

In a preferred embodiment, the resin film-forming composition further comprises at least one component of (E) a flame retardant, (F) an antioxidant, and (G) a filler.

Typically, the base film is formed of polyester, polyimide, polyamide, polyamide-imide, polyetherimide, triacetate cellulose, polyethersulfone or polyphenylene sulfide.

In another aspect, the invention provides a substrate processing laminate comprising a substrate and the surface protective film (defined above) disposed on at least one surface of the substrate.

In a further aspect, the invention provides a method for preparing a surface protective film comprising a base film and a resin film formed thereon, the method comprising the steps of applying a surface protective resin composition onto the base film and heat curing the composition into the resin film, the resin composition comprising components (A) to (D) defined above.

In a still further aspect, the invention provides a method for protecting a substrate having a circuit-forming surface, comprising the steps of attaching the surface protective film defined above to the circuit-forming surface of the substrate, and heat curing the resin film to bond the surface protective film to the substrate.

Advantageous Effects of Invention

Since the surface protective film is formed of a resin composition comprising a resin containing a silane (silylbenzene) skeleton and a parting agent, the bonding force is adjusted to a moderate level such that the film bonded to a substrate may be difficultly stripped during processing of the substrate, but smoothly stripped at the end of processing. The film is best suited for temporary bonding to the substrate.

Since the resin contains a silphenylene skeleton and thus has a high strength, the surface protective film is not broken upon stripping. The film can be stripped without leaving any resin and additive residues on the substrate. Since the resin is a thermosetting resin, the film has heat resistance and pressure resistance and avoids any troubles during processing of the substrate. In addition, since the parting agent in the surface protective film functions to mitigate the internal stress induced by thermal expansion of the cured resin, the film is unlikely to strip even at high temperature.

Once the substrate is protected with the surface protective film, the protected substrate surface is not damaged or stained over a long term during processing and handling of the substrate. A reduction of failure rate is expectable. The method for preparing the surface protective film is easy because only direct coating and heat curing steps are involved.

DESCRIPTION OF PREFERRED EMBODIMENTS

The notation (Cn-Cm) means a group containing from n to m carbon atoms per group. In the chemical formula, Me stands for methyl, and Ph for phenyl.

Surface Protective Film

One embodiment of the invention is a surface protective film comprising a base film and a resin film formed thereon.

The resin film is formed of a resin composition comprising (A) a silphenylene-siloxane skeleton-containing resin, (B) a compound capable of reacting with an epoxy group in the resin to form a crosslinked structure, (C) a curing catalyst, and (D) a parting agent.

(A) Silphenylene-Siloxane Skeleton-Containing Resin

Component (A) is a silphenylene-siloxane skeleton-containing resin represented by the formula (1).

(1)

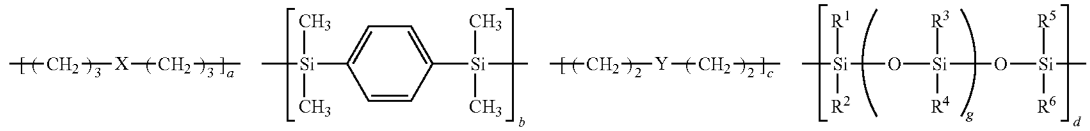

In formula (1), $R^1$ to $R^6$, which may be the same or different, are each independently a $C_1$-$C_{20}$ monovalent hydrocarbon group or alkoxy group. The monovalent hydrocarbon groups include straight, branched or cyclic alkyl, alkenyl and alkynyl groups, but are not limited thereto. Preferably $R^1$ to $R^6$ are $C_1$-$C_{12}$ monovalent hydrocarbon groups or alkoxy groups, more preferably $C_1$-$C_{10}$ monovalent hydrocarbon groups or alkoxy groups, and even more preferably $C_1$-$C_6$ monovalent hydrocarbon groups or alkoxy groups.

Preferred examples of $R^1$ to $R^6$ are given below.

—$CH_3$, —$CH_2$—$CH_3$, —$(CH_2)_4$—$CH_3$, —$(CH_2)_6$—$CH_3$, —$(CH_2)_8$—$CH_3$,
—$(CH_2)_{10}$—$CH_3$, —$(CH_2)_{15}$—$CH_3$, —$(CH_2)_{19}$—$CH_3$, —CH═CH—$CH_3$, —C≡C—$CH_3$,
—CH═CH—CH═CH—$CH_3$, —CH═CH—C≡C—$CH_3$, —$CH(CH_3)$—$CH_3$,
—$C(CH_3)(CH_3)$—$CH_3$, —$CH_2$—$CH(CH_3)$—$CH_3$, —$CH_2$—$CH(CH_3)$—$CH(CH_3)$—$CH_3$,
—$CH_2$—$CH(CH_2CH_2CH_3)$—$CH_3$, —$CH_2$—$C(CH_2CH_2CH_3)(CH_2CH_2CH_3)$—$CH_3$,
—$CH_2$—$C(CH_2CH(CH_3)CH_3)(CH_2CH_2CH_3)$—$CH_3$,
—$CH_2$—$C(CH_2CH(CH_3)CH_3)(CH_2C(CH_3)(CH_3)CH_3)$—$CH_3$,
—$OCH_3$, —$OCH_2CH_3$, —$OCH(CH_3)CH_3$, —$O(CH_2)_3CH_3$, —$OC(CH_3)_2C$≡CH

The subscripts a, b, c, and d, indicative of compositional ratios of corresponding repeating units, are positive numbers satisfying: $0<a<1$, $0<b<1$, $0\leq c<1$, $0<d<1$, $0.35\leq a+c\leq 0.65$, $0.35\leq b+d\leq 0.65$, and $a+b+c+d=1$, preferably $a+b>c$. If the sum of a and c or the sum of b and d is outside the range, a polymer may have a low molecular weight. More preferably, a, b, c and d satisfy $a+c=0.5$ and $b+d=0.5$. The subscript g is an integer of 0 to 300.

In the resin of formula (1), siloxane units are preferably contained in an amount of 40 to 80% by weight, more preferably 50 to 75% by weight, and even more preferably 60 to 70% by weight based on the overall repeating units. If the siloxane unit content is below the range, stripping may become heavy. If the siloxane unit content is above the range, the stripping force may become low, indicating the likelihood of striping during working. In the resin of formula (1), silphenylene units are preferably contained in an amount of 2 to 15% by weight, more preferably 3 to 12% by weight, and even more preferably 4 to 8% by weight based on the overall repeating units. If the silphenylene unit content is above the range, the resin becomes so hard that the resin may be broken upon stripping, leaving resin residues on the substrate surface. If the silphenylene unit content is below the range, the resin lacks strength so that the resin may be broken upon stripping, leaving resin residues after stripping.

In formula (1), X is a divalent organic group having the formula (2).

(2)

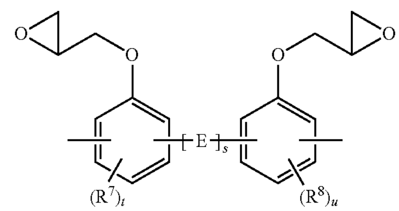

E is a divalent organic group selected from the following.

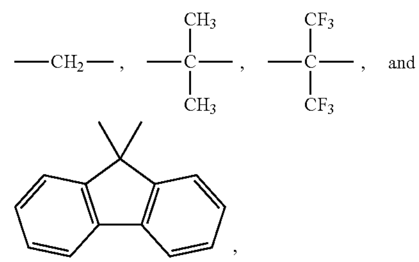

The subscript s is 0 or 1, $R^7$ and $R^8$ are each independently a $C_1$-$C_{20}$ monovalent hydrocarbon group or alkoxy group, t and u are each independently an integer of 0 to 2.

In formula (2), $R^7$ and $R^8$ are each independently a $C_1$-$C_{20}$ monovalent hydrocarbon group or alkoxy group. The monovalent hydrocarbon groups include straight, branched or cyclic alkyl, alkenyl and alkynyl groups, but are not limited thereto. Preferably $R^7$ and $R^8$ are $C_1$-$C_{12}$ monovalent hydrocarbon groups or alkoxy groups, more preferably $C_1$-$C_{10}$ monovalent hydrocarbon groups or alkoxy groups, and even more preferably $C_1$-$C_6$ monovalent hydrocarbon groups or alkoxy groups.

Preferred examples of $R^7$ and $R^8$ are given below.

—$CH_3$, —$CH_2$—$CH_3$, —$(CH_2)_4$—$CH_3$, —$(CH_2)_6$—$CH_3$, —$(CH_2)_8$—$CH_3$,
—$(CH_2)_{10}$—$CH_3$, —$(CH_2)_{15}$—$CH_3$, —$(CH_2)_{19}$—$CH_3$, —CH═CH—$CH_3$, —C≡C—$CH_3$,
—CH═CH—CH═CH—$CH_3$, —CH═CH—C≡C—$CH_3$, —$CH(CH_3)$—$CH_3$, —$C(CH_3)(CH_3)$—$CH_3$,
—$CH_2$—$CH(CH_3)$—$CH_3$, —$CH_2$—$CH(CH_3)$—$CH(CH_3)$—$CH_3$, —$CH_2$—$CH(CH_2CH_2CH_3)$—$CH_3$,
—$CH_2$—$C(CH_2CH_2CH_3)(CH_2CH_2CH_3)$—$CH_3$,
—$CH_2$—$C(CH_2CH(CH_3)CH_3)(CH_2CH_2CH_3)$—$CH_3$,
—$CH_2$—$C(CH_2CH(CH_3)CH_3)(CH_2C(CH_3)(CH_3)CH_3)$—$CH_3$,
—$OCH_3$, —$OCH_2CH_3$, —$OCH(CH_3)CH_3$, —$O(CH_2)_3CH_3$, —$OC(CH_3)_2C$≡CH

In formula (2), s is 0 or 1, t and u are each independently an integer of 0 to 2.

In formula (1), Y is a divalent siloxane chain having the formula (3).

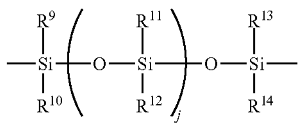

(3)

In formula (3), $R^9$ to $R^{14}$, which may be the same or different, are each independently a $C_1$-$C_{20}$ monovalent hydrocarbon group or alkoxy group. The monovalent hydrocarbon groups include straight, branched or cyclic alkyl, alkenyl, alkynyl and aryl groups, but are not limited thereto. Also included are alkyl, alkenyl and alkynyl groups in which at least one hydrogen atom is substituted by an aryl group, and aryl groups in which at least one hydrogen atom is substituted by an alkyl, alkenyl or alkynyl group, provided that the total number of carbon atoms in the substituted group is up to 20.

Preferably $R^9$ to $R^{14}$ are $C_1$-$C_{12}$ monovalent hydrocarbon groups, more preferably $C_1$-$C_{10}$ monovalent hydrocarbon groups, and even more preferably $C_1$-$C_6$ alkyl or phenyl groups.

Preferred examples of $R^9$ to $R^{14}$ are given below.

—$CH_3$, —$CH_2$—$CH_3$, —$(CH_2)_4$—$CH_3$, —$(CH_2)_6$—$CH_3$, —$(CH_2)_8$—$CH_3$,
—$(CH_2)_{10}$—$CH_3$, —$(CH_2)_{15}$—$CH_3$, —$(CH_2)_{19}$—$CH_3$, —CH═CH—$CH_3$,—C≡$CH_3$,
—CH═CH—CH═CH—$CH_3$, —CH═CH—C≡C—$CH_3$, —$CH(CH_3)$—$CH_3$, —$C(CH_3)(CH_3)$—$CH_3$,
—$CH_2$—$CH(CH_3)$—$CH_3$, —$CH_2$—$CH(CH_3)$—$CH(CH_3)$—$CH_3$, —$CH_2$—$CH(CH_2CH_2CH_3)$—$CH_3$,
—$CH_2$—$C(CH_2CH_2CH_3)(CH_2CH_2CH_3)$—$CH_3$,
—$CH_2$—$C(CH_2CH(CH_3)CH_3)(CH_2CH_2CH_3)$—$CH_3$,
—$CH_2$—$C(CH_2CH(CH_3)CH_3)(CH_2C(CH_3)(CH_3)CH_3)$—$CH_3$,

—$OCH_3$, —$OCH_2CH_3$, —$OCH(CH_3)CH_3$, —$O(CH_2)_3CH_3$, —$OC(CH_3)_2C$≡CH, phenyl In formula (3), j is an integer of 0 to 300, preferably 0 to 200, more preferably 30 to 150, and even more preferably 50 to 100. If j is more than 300, the bonding force is substantially reduced, with a possibility that the film strips from the substrate surface during working.

Examples of the group having formula (3) are given below, but not limited thereto.

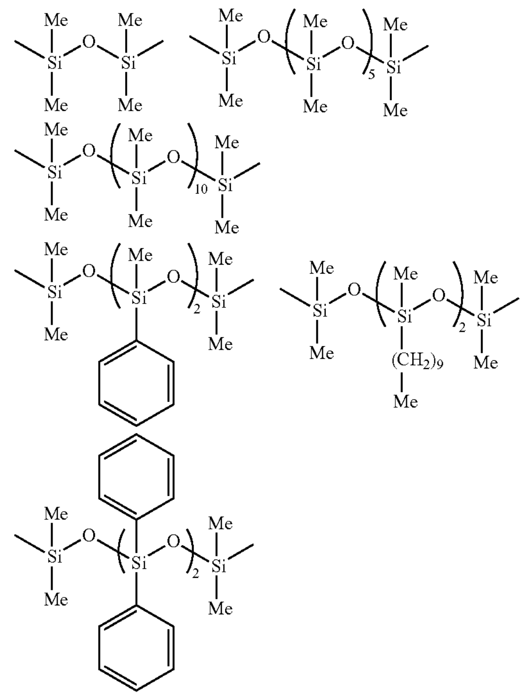

Examples of the resin having formula (1) are given below, but not limited thereto.

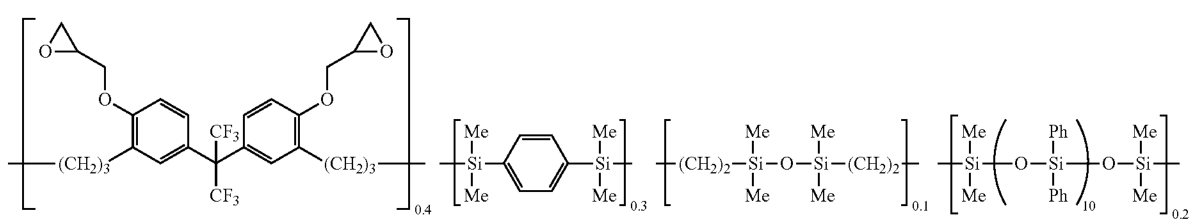

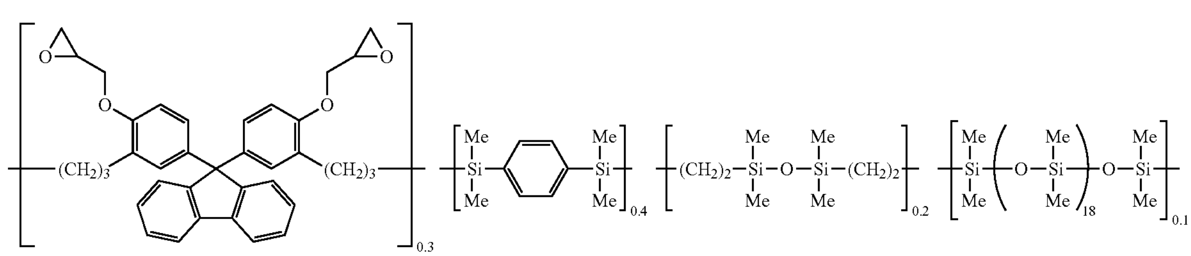

-continued

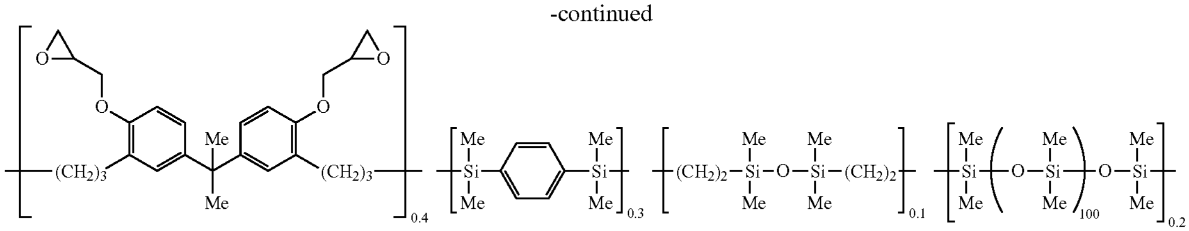

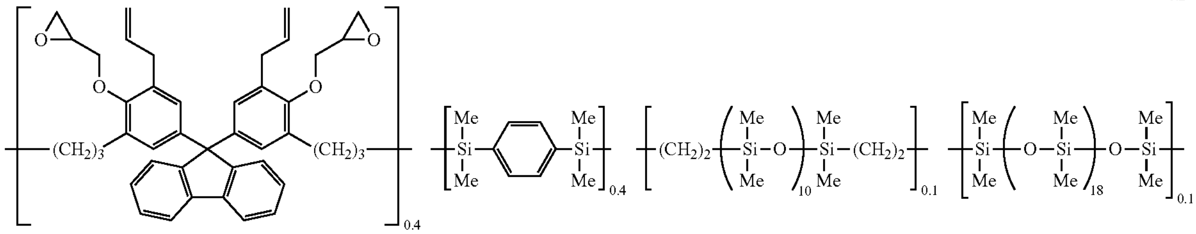

The resin (A) should have a weight average molecular weight (Mw) of 10,000 to 100,000, preferably 25,000 to 60,000. A resin with Mw of less than 10,000, which may not be solid sometimes, is inadequate as a film-forming material whereas a resin with Mw in excess of 100,000 is too viscous to handle. In the disclosure, Mw is measured versus polystyrene standards by gel permeation chromatography (GPC) using tetrahydrofuran solvent.

In the resin (A), the respective units may be arranged randomly or blockwise (to form a random or block copolymer).

The resin (A) may be prepared using a silphenylene compound having the formula (4) and compounds selected from compounds having the formulae (5) to (7) by the method to be described below.

(4)

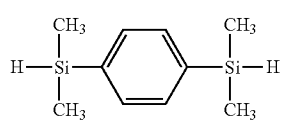

(5)

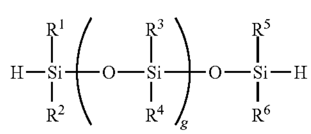

(6)

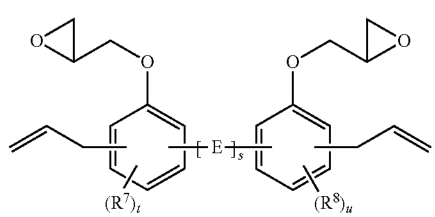

(7)

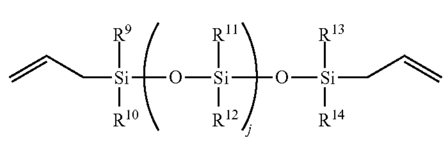

Herein $R^1$ to $R^{14}$, E, g, s, t, u and j are as defined above.

The resin (A) may be synthesized by hydrosilylation of reactants. In one procedure, all reactants are fed in a reactor where reactions are effected. In another procedure, some reactants are previously reacted before the remaining reactants are fed and reacted. In a further procedure, reactants are reacted one by one. In any case, the order of reactions is arbitrary.

The polymerization reaction is performed in the presence of a catalyst. Any catalysts which are known to promote hydrosilylation may be used. For example, palladium complexes, rhodium complexes and platinum complexes may be used, although the catalyst is not limited thereto. The catalyst is preferably added in an amount of about 0.01 to 10.0 mol % relative to Si—H bond. With a less amount of the catalyst, the reaction may be slow or proceed to a less extent. A larger amount of the catalyst may provoke dehydrogenation reaction, which interferes with the progress of addition reaction.

The polymerization reaction may be performed in a solvent which is selected from organic solvents which do not interfere with hydrosilylation. Suitable solvents include octane, toluene, tetrahydrofuran and dioxane, but are not limited thereto. The solvent is preferably used in such an amount as to give a solute concentration of 10 to 70% by weight. If the amount of the solvent is larger than the range, the reaction system is so thin that the progress of reaction may be slow. If the amount of the solvent is less than the range, the reaction system is so viscous that effective stirring is inhibited in mid course.

Typically the reaction is performed at a temperature of 40 to 150° C., preferably 60 to 120° C., and more preferably 70 to 100° C. Outside the range, side reactions such as decomposition may occur at a higher temperature whereas the progress of reaction is slow at a lower temperature. The reaction time is typically 0.5 to 60 hours, preferably 3 to 24 hours, and more preferably 5 to 12 hours.

(B) Crosslinking Compound

Component (B) is a compound capable of reacting with an epoxy group in the silphenylene-siloxane skeleton-containing resin (A) to form a crosslinked structure. It is preferably a compound containing at least two phenolic hydroxyl groups per molecule, but not limited thereto. The number of phenolic hydroxyl groups per molecule is preferably 2 to about 10. A compound containing only one phenolic hydroxyl group per molecule fails to crosslink so that the resin is not cured. A compound containing more than 10 phenolic hydroxyl groups per molecule causes substantial cure shrinkage and is impractical. As long as the number of phenolic hydroxyl groups is in the range, the structure of the compound is not particularly limited. Preferred exemplary compounds are given below.

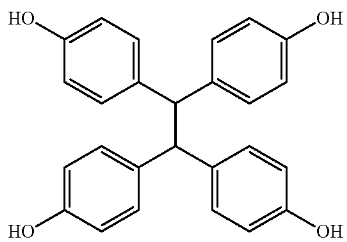

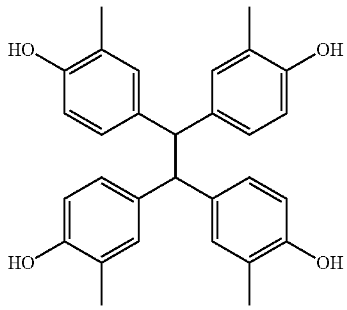

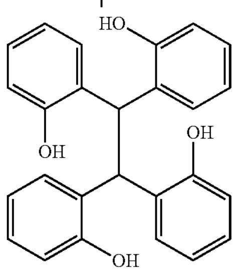

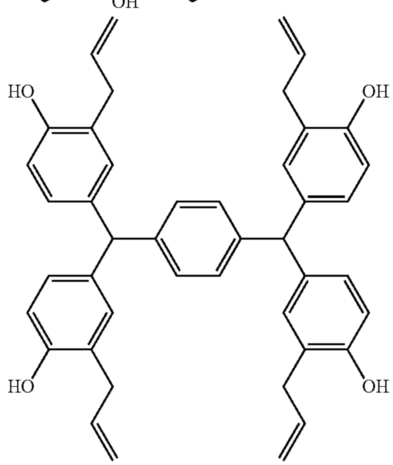

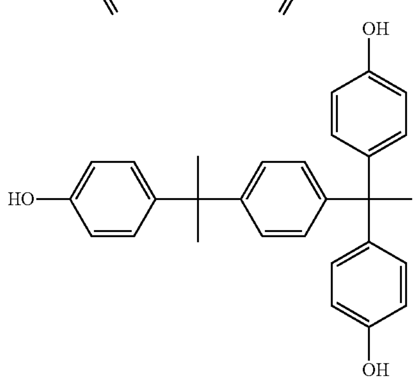

-continued

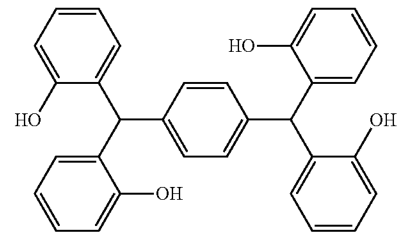

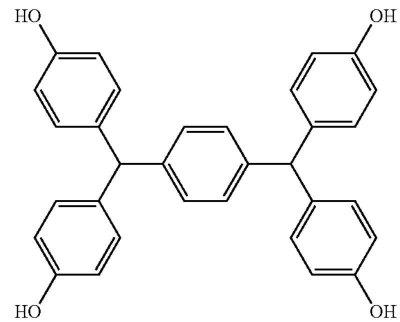

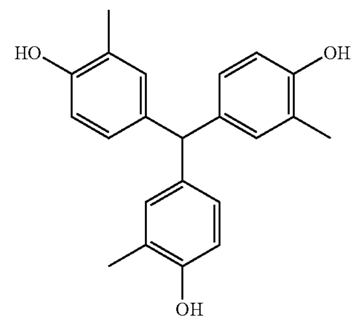

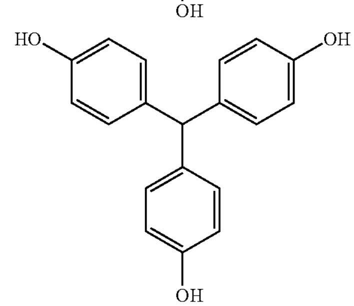

Component (B) is preferably used in an amount of 5 to 50 parts by weight, more preferably 8 to 20 parts by weight per 100 parts by weight of component (A). As long as the amount of component (B) is in the range, component (B) reacts with component (A) to a full extent so that the cured product becomes tougher.

(C) Curing Catalyst

Component (C) is a curing catalyst which is selected from a wide variety of catalysts which are used for ring opening of an epoxy group. Suitable curing catalysts include, but are not limited to, imidazole compounds such as imidazole, 2-methylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole, 1-cyanoethyl-2-methylimidazole, 1-cyanoethyl-2-undecylimidazole, 1-cyanoethyl-2-ethyl-4-methylimidazole,
1-cyanoethyl-2-phenylimidazole,
2-phenyl-4,5-dihydroxymethylimidazole, and
2-phenyl-4-methyl-5-hydroxymethylimidazole; and
1,8-diazabicyclo[5.4.0]-undecene-7,
tris(dimethylaminomethyl)phenol, triphenylphosphine, and tetraphenylphosphonium tetraphenylborate.

Component (C) is preferably used in an amount of 0.01 to 30 parts by weight, more preferably 1 to 5 parts by weight per 100 parts by weight of component (A). As long as the amount of component (C) is in the range, undercure is avoided and shelf stability is satisfactory.

(D) Parting Agent

Component (D) is a parting agent which is selected from the group consisting of polyethylenes, silicone compounds, fluorine compounds, fatty acids, and fatty acid esters, which may be used alone or in admixture. Inter alia, a silicone compound is preferably selected for compatibility.

Suitable polyethylenes include low-molecular-weight polyethylene, low-molecular-weight polyethylene copolymers, and modified polyethylene waxes obtained by oxidative or acidic modification of the foregoing to introduce a polar group. The polyethylene preferably has a number average molecular weight (Mn) of 500 to 15,000, more preferably 1,000 to 10,000, as measured versus polystyrene standards by GPC using tetrahydrofuran solvent.

The polyethylene waxes such as low-molecular-weight polyethylene and low-molecular-weight polyethylene copolymers may be prepared by various methods, for example, direct polymerization of ethylene or ethylene and α-olefin in the presence of a Ziegler catalyst, recovery as a by-product during preparation of high-molecular-weight polyethylene or copolymers, or pyrolysis of high-molecular-weight polyethylene or copolymers. Of these polyethylene waxes, copolymer type polyethylene waxes consisting of 50 to 99 mol % of ethylene and 1 to 50 mol % of α-olefin are preferred, with those polyethylene waxes wherein the α-olefin is polypropylene being more preferred.

Oxidative modified polyethylene waxes are obtained by treating polyethylene waxes with peroxide or oxygen to introduce polar groups such as carboxyl or hydroxyl therein. Acidic modified polyethylene waxes are obtained by treating polyethylene waxes with inorganic acids, organic acids or unsaturated carboxylic acids, optionally in the presence of peroxide or oxygen, to introduce polar groups such as carboxyl or sulfonic acid therein. These polyethylene waxes are commercially available in the name of general high density polyethylene wax, general low density polyethylene wax, low oxidation type polyethylene wax, high oxidation type polyethylene wax, acidic modified polyethylene wax, or special monomer modified polyethylene wax and may be purchased from many suppliers. Typical examples include waxes such as polyethylene waxes and carnauba wax, fatty acids such as stearic acid and metal salts thereof. Inter alia, carnauba wax is most preferred for bonding and parting properties.

Suitable silicone compounds include a silicone oil of polydimethylsiloxane, a silicone oil of polydimethylsiloxane in which some methyl groups are substituted by phenyl groups, a silicone oil of polydimethylsiloxane in which some methyl groups are substituted by hydrogen or alkyl groups of two or more carbon atoms, a silicone oil of polydimethylsiloxane in which some methyl groups are substituted by halogenated phenyl groups, a silicone oil of polydimethylsiloxane in which some methyl groups are substituted by fluoroester groups, epoxy-modified silicone oils such as epoxy-containing polydimethylsiloxane, amino-modified silicone oils such as amino-containing polydimethylsiloxane, alkyl-aralkyl silicone oils such as a silicone oil consisting of dimethylsiloxane and phenylmethylsiloxane, polyether-modified silicone oils such as polydimethylsiloxane in which some methyl groups in dimethylsiloxane units are substituted by polyether, and alkyl-aralkyl polyether-modified silicone oils such as a dimethylsiloxane/phenylmethylsiloxane polymer in which some methyl groups in dimethylsiloxane units are substituted by polyether. The silicone compound should preferably have a Mw of 500 to 20,000, more preferably 5,000 to 10,000. A silicone oil with too low Mw will evaporate and cause contamination to the surrounding equipment whereas a silicone oil with too high Mw may be too viscous to handle.

Suitable fluorine compounds include compounds containing polyfluoroalkyl groups or polyfluoroalkyl ether groups of 3 to 40 carbon atoms, especially 5 to 20 carbon atoms. Exemplary compounds include $C_{12}F_{25}NH_3OOCC_3H_7$, $C_3F_7OC_3H_6Si(OCH_3)_3$, and $C_8F_{17}SC_2H_4COOH$.

Suitable fatty acids include saturated and unsaturated fatty acids of at least 12 carbon atoms. Exemplary of the fatty acid are lauric acid, tridecylic acid, myristic acid, pentadecylic acid, palmitic acid, heptadecylic acid, stearic acid, nonadecanoic acid, arachidic acid, behenic acid, lignoceric acid, cerotic acid, heptacosanoic acid, montanic acid, melissic acid, lacceric acid, oleic acid, elaidic acid, linoleic acid, linolenic acid, arachidonic acid, cetoleic acid, and erucic acid. Inter alia, $C_{12}$-$C_{22}$ saturated fatty acids are preferred.

Suitable fatty acid esters include esters of $C_5$-$C_{32}$ fatty acids with $C_2$-$C_{30}$ mono- or polyhydric alcohols. Exemplary fatty acids include saturated fatty acids such as caproic acid, caprylic acid, undecylic acid, lauric acid, tridecylic acid, myristic acid, palmitic acid, stearic acid, behenic acid, lignoceric acid, cerotic acid, montanic acid, and melissic acid; unsaturated fatty acids such as oleic acid, elaidic acid, linoleic acid, linolenic acid, arachidonic acid, docosenoic acid, erucic acid, and ricinoleic acid. Exemplary alcohols include monohydric alcohols such as propyl alcohol, isopropyl alcohol, butyl alcohol, octyl alcohol, capryl alcohol, lauryl alcohol, myristyl alcohol, stearyl alcohol, and behenyl alcohol; and polyhydric alcohols such as ethylene glycol, propylene glycol, butanediol, glycerol, pentaerythritol, and sorbitan. The preferred fatty acid esters are esters of $C_{12}$-$C_{22}$ fatty acids with $C_2$-$C_{22}$ mono- or polyhydric alcohols.

Component (D) is used in an amount of 0.5 to 20 parts by weight, preferably 2 to 12 parts by weight per 100 parts by weight of component (A) or the resin having formula (1). Less than 0.5 part of component (D) fails to impart parting properties or heat resistance, with a risk that the substrate (protected with the film) is broken. More than 20 parts of component (D) leads to a drop of heat resistance in a low temperature region, causing contamination of the substrate surface.

By using the parting agent in combination with the resin having formula (1), the resin is rendered more compatible with the substrate surface to be protected. The bonding of the film to the substrate is improved over a long term. The addition of the parting agent is also effective for improving heat resistance. This is because the parting agent functions to mitigate the internal stress caused by thermal expansion of the cured resin product for thereby preventing the film from stripping from the substrate surface.

(E) Flame Retardant

The resin film or resin composition may further comprise (E) a flame retardant for preventing combustion. Organic flame retardants such as phosphoric acid esters are appropriate.

Suitable phosphoric acid esters include esters of phosphorous acid, phosphoric acid, phosphonous acid, and phosphonic acid.

Exemplary phosphites include triphenyl phosphite, tris(nonylphenyl) phosphite,
tris(2,4-di-t-butylphenyl) phosphite,
distearyl pentaerythritol diphosphite,
bis(2,6-di-t-butyl-4-methylphenyl)pentaerythritol diphosphite,
and bis(2,4-di-t-butylphenyl)pentaerythritol diphosphite.

Exemplary phosphates include triphenyl phosphate, tris(nonylphenyl) phosphate,
tris(2,4-di-t-butylphenyl) phosphate,
distearyl pentaerythritol diphosphate,
bis(2,6-di-t-butyl-4-methylphenyl) pentaerythritol diphosphate,
bis(2,4-di-t-butylphenyl) pentaerythritol diphosphate,
tributyl phosphate, and bisphenol-A bis(diphenyl phosphate).

Exemplary of the phosphonous acid ester is tetrakis(2,4-di-t-butylphenyl)-4,4'-biphenylene phosphonite.

Exemplary of the phosphonic acid ester are dimethyl benzenephosphonate and benzenephosphonic acid esters.

Of the phosphoric acid esters, phosphites, phosphates, and phosphonates are preferred, with the phosphates being most preferred.

Component (E) is preferably added in an amount of 0 to 40% by weight, and when used, in an amount of 0.1 to 40% by weight, more preferably 5 to 20% by weight, based on the surface protective film. As long as the amount of component (E) is in the range, the desired effect is exerted. The flame retardant may be used alone or in admixture.

(F) Antioxidant

The resin film or resin composition may further comprise (F) an antioxidant for improving thermal stability. The antioxidant is preferably at least one compound selected from among hindered phenol compounds, hindered amine compounds, organophosphorus compounds, and organosulfur compounds.

Although the hindered phenol compounds used herein are not particularly limited, the hindered phenol compounds listed below are preferred.

1,3,5-trimethyl-2,4,6-tris(3,5-di-t-butyl-4-hydroxybenzyl) benzene (trade name: IRGANOX 1330),
2,6-di-t-butyl-4-methylphenol (trade name: Sumilizer BHT),
2,5-di-t-butylhydroquinone (trade name: Nocrac NS-7),
2,6-di-t-butyl-4-ethylphenol (trade name: Nocrac M-17),
2,5-di-t-pentylhydroquinone (trade name: Nocrac DAH),
2,2'-methylenebis(4-methyl-6-t-butylphenol) (trade name: Nocrac NS-6),
3,5-di-t-butyl-4-hydroxybenzyl phosphonate diethyl ester (trade name: IRGANOX 1222),
4,4'-thiobis(3-methyl-6-t-butylphenol) (trade name: Nocrac 300),
2,2'-methylenebis(4-ethyl-6-t-butylphenol) (trade name: Nocrac NS-5),
4,4'-butylidenebis(3-methyl-6-t-butylphenol) (Adeka Stab AO-40),
2-t-butyl-6-(3-t-butyl-2-hydroxy-5-methylbenzyl)-4-methylphenyl acrylate (trade name: Sumilizer GM),
2-[1-(2-hydroxy-3,5-di-t-pentylphenyl)ethyl]-4,6-di-t-pentylphenyl acrylate (trade name: Sumilizer GS),
2,2'-methylenebis[4-methyl-6-(α-methylcyclohexyl)phenol],
4,4'-methylenebis(2,6-di-t-butylphenol) (trade name: Seenox 226M),
4,6-bis(octylthiomethyl)-o-cresol (trade name: IRGANOX 1520L),
2,2'-ethylenebis(4,6-di-t-butylphenol),
octadecyl 3-(3,5-di-t-butyl-4-hydroxyphenyl)propionate (trade name: IRGANOX 1076),
1,1,3-tris(2-methyl-4-hydroxy-5-t-butylphenyl)butane (trade name: Adeka Stab AO-30),
tetrakis[methylene-(3,5-di-t-butyl-4-hydroxyhydrocinnamate)]methane (trade name: Adeka Stab AO-60),
triethylene glycol bis[3-(3-t-butyl-5-methyl-4-hydroxyphenyl)propionate] (trade name: IRGANOX 245),
2,4-bis(n-octylthio)-6-(4-hydroxy-3,5-di-t-butylanilino)-1,3,5-triazine (trade name: IRGANOX 565),
N,N'-hexamethylenebis(3,5-di-t-butyl-4-hydroxyhydrocinnamide) (trade name: IRGANOX 1098),
1,6-hexanediol-bis[3-(3,5-di-t-butyl-4-hydroxyphenyl)propionate] (trade name: IRGANOX 259),
2,2-thio-diethylenebis[3-(3,5-di-t-butyl-4-hydroxyphenyl) propionate] (trade name: IRGANOX 1035),
3,9-bis[2-[3-(3-t-butyl-4-hydroxy-5-methylphenyl)propionyloxy]-1,1-dimethylethyl]
2,4,8,10-tetraoxaspiro[5.5]undecane (trade name: Sumilizer GA-80),
tris(3,5-di-t-butyl-4-hydroxybenzyl) isocyanurate (trade name: IRGANOX 3114),
bis(ethyl 3,5-di-t-butyl-4-hydroxybenzylphosphonate) calcium/polyethylene wax 50/50 mixture (trade name: IRGANOX 1425WL),
isooctyl 3-(3,5-di-t-butyl-4-hydroxyphenyl)propionate (trade name: IRGANOX 1135),
4,4'-thiobis(6-t-butyl-3-methylphenol) (trade name: Sumilizer WX-R),
6-[3-(3-t-butyl-4-hydroxy-5-methylphenyl)propoxy]-2,4,8,10-tetra-t-butyldibenzo[d,f][1,3,2]dioxaphosphepin (trade name: Sumilizer GP), etc.

Although the hindered amine compounds used herein are not particularly limited, the hindered amine compounds listed below are preferred.

p,p'-dioctyldiphenylamine (trade name: IRGANOX 5057),
phenyl-α-naphthylamine (Nocrac PA),
poly(2,2,4-trimethyl-1,2-dihydroquinoline) (trade name: Nocrac 224, 224-S),
6-ethoxy-2,2,4-trimethyl-1,2-dihydroquinoline (trade name: Nocrac AW),
N,N'-diphenyl-p-phenylenediamine (trade name: Nocrac DP),
N,N'-di-β-naphthyl-p-phenylenediamine (trade name: Nocrac White),
N-phenyl-N'-isopropyl-p-phenylenediamine (trade name: Nocrac 810NA),
N,N'-diallyl-p-phenylenediamine (trade name: Nonflex TP),
4,4'-(α,α-dimethylbenzyl)diphenylamine (trade name: Nocrac CD),
p,p-toluenesulfonylaminodiphenylamine (trade name: Nocrac TD),
N-phenyl-N'-(3-methacryloxy-2-hydroxypropyl)-p-phenylenediamine (trade name: Nocrac G1),
N-(1-methylheptyl)-N'-phenyl-p-phenylenediamine (trade name: Ozonon 35),
N,N'-di-sec-butyl-p-phenylenediamine (trade name: Sumilizer BPA),
N-phenyl-N'-1,3-dimethylbutyl-p-phenylenediamine (trade name: Antigene 6C),
alkylated diphenylamine (trade name: Sumilizer 9A),
dimethyl-1-(2-hydroxyethyl)-4-hydroxy-2,2,6,6-tetramethylpiperidine succinate polycondensate (trade name: Tinuvin 622LD), poly[[6-(1,1,3,3-tetramethylbutyl)amino]-1,3,5-triazine-2,4-diyl][(2,2,6,6-tetramethyl-4-piperidyl)imino]hexamethylene[(2,2,6,6-tetramethyl-4-piperidyl)imino]] (trade name: CHIMASSORB 944),
N,N'-bis(3-aminopropyl)ethylenediamine-2,4-bis[N-butyl-N-(1,2,2,6,6-pentamethyl-4-piperidyl)amino]-6-chloro-1,3,5-triazine condensate (trade name: CHIMASSORB 119FL),
bis(1-octyloxy-2,2,6,6-tetramethyl-4-piperidyl)sebacate (trade name: Tinuvin 123),
bis(2,2,6,6-tetramethyl-4-piperidyl)sebacate (trade name: Tinuvin 770),
bis(1,2,2,6,6-pentamethyl-4-piperidyl) 2-(3,5-di-t-butyl-4-hydroxybenzyl)-2-n-butylmalonate (trade name: Tinuvin 144),
bis(1,2,2,6,6-pentamethyl-4-piperidyl)sebacate (trade name: Tinuvin 765),
tetrakis(1,2,2,6,6-pentamethyl-4-piperidyl) 1,2,3,4-butanetetracarboxylate (trade name: LA-57),
tetrakis(2,2,6,6-tetramethyl-4-piperidyl) 1,2,3,4-butanetetracarboxylate (trade name: LA-52),
an esterified mixture of 1,2,3,4-butanetetracarboxylic acid with 1,2,2,6,6-pentamethyl-4-piperidinol and 1-tridecanol (trade name: LA-62),
an esterified mixture of 1,2,3,4-butanetetracarboxylic acid with 2,2,6,6-tetramethyl-4-piperidinol and 1-tridecanol (trade name: LA-67),
an esterified mixture of 1,2,3,4-butanetetracarboxylic acid with 1,2,2,6,6-pentamethyl-4-piperidinol and 3,9-bis(2-hydroxy-1,1-dimethylethyl)-2,4,8,10-tetraoxaspiro[5.5]undecane (trade name: LA-63P),
an esterified mixture of 1,2,3,4-butanetetracarboxylic acid with 2,2,6,6-tetramethyl-4-piperidinol and 3,9-bis(2-hydroxy-1,1-dimethylethyl)-2,4,8,10-tetraoxaspiro[5.5]undecane (trade name: LA-68LD),
(2,2,6,6-tetramethylene-4-piperidyl)-2-propylene carboxylate (trade name: Adeka Stab LA-82),
(1,2,2,6,6-pentamethyl-4-piperidyl)-2-propylene carboxylate (trade name: Adeka Stab LA-87), etc.

Although the organophosphorus compounds used herein are not particularly limited, the organophosphorus compounds listed below are preferred.

bis(2,4-di-t-butylphenyl)[1,1-biphenyl]-4,4'-diyl bisphosphite,
9,10-dihydro-9-oxa-10-phosphaphenanthrene-10-oxide (trade name: Sanko HCA),
triethyl phosphite (trade name: JP302),
tri-n-butyl phosphite (trade name: JP304),
triphenyl phosphite (trade name: Adeka Stab TPP),
diphenyl monooctyl phosphite (trade name: Adeka Stab C),
tri(p-cresyl) phosphite (trade name: Chelex-PC),
diphenyl monodecyl phosphite (trade name: Adeka Stab 135A),
diphenyl mono(tridecyl) phosphite (trade name: JPM313),
tris(2-ethylhexyl) phosphite (trade name: JP308),
phenyl didecyl phosphite (trade name: Adeka Stab 517),
tridecyl phosphite (trade name: Adeka Stab 3010),
tetraphenyl dipropylene glycol diphosphite (trade name: JPP100),
bis(2,4-di-t-butylphenyl) pentaerythritol diphosphite (trade name: Adeka Stab PEP-24G),
tris(tridecyl) phosphite (trade name: JP333E),
bis(nonylphenyl) pentaerythritol diphosphite (trade name: Adeka Stab PEP-4C),
bis(2,6-di-t-butyl-4-methylphenyl) pentaerythritol diphosphite (trade name: Adeka Stab PEP-36),
bis[2,4-di(1-phenylisopropyl)phenyl] pentaerythritol diphosphite (trade name: Adeka Stab PEP-45),
trilauryl trithiophosphite (trade name: JPS312),
tris(2,4-di-t-butylphenyl) phosphite (trade name: IRGAFOS 168),
tris(nonylphenyl) phosphite (trade name: Adeka Stab 1178),
distearyl pentaerythritol diphosphite (trade name: Adeka Stab PEP-8),
tris(mono, dinonylphenyl) phosphite (trade name: Adeka Stab 329K),
trioleyl phosphite (trade name: Chelex-OL),
tristearyl phosphite (trade name: JP318E),
4,4'-butylidene bis(3-methyl-6-t-butylphenylditridecyl) phosphite (trade name: JPH1200),
tetra(mixed $C_{12}$-$C_{15}$ alkyl)-4,4'-isopropylidene diphenyl diphosphite (trade name: Adeka Stab 1500),
tetra(tridecyl)-4,4'-butylidene bis(3-methyl-6-t-butylphenyl) diphosphite (trade name: Adeka Stab 260),
hexa(tridecyl)-1,1,3-tris(2-methyl-5-t-butyl-4-hydroxyphenyl)butane triphosphite (trade name: Adeka Stab 522A),
hydrogenated bisphenol A phosphite polymer (HBP),
tetrakis(2,4-di-t-butylphenyloxy)-4,4'-biphenylene diphosphine (trade name: P-EPQ),
tetrakis(2,4-di-t-butyl-5-methylphenyloxy) 4,4'-biphenylene diphosphine (trade name: GSY-101P),
2-[[2,4,8,10-tetrakis(1,1-dimethylethyl)dibenzo[d,f][1,3,2]dioxaphosphepin-6-yl]oxy]-N,N-bis[2-[[2,4,8,10-tetrakis(1,1-dimethylethyl)dibenzo[d,f][1,3,2]dioxaphosphepin-6-yl]oxy]-ethyl]ethanamine (trade name: IRGAFOS 12),
2,2'-methylenebis(4,6-di-t-butylphenyl)octyl phosphite (trade name: Adeka Stab HP-10), etc.

Although the organosulfur compounds used herein are not particularly limited, the organosulfur compounds listed below are preferred.

dilauryl 3,3'-thiodipropionate (trade name: Sumilizer TPL-R),
dimyristyl 3,3'-thiodipropionate (trade name: Sumilizer TPM),
distearyl 3,3'-thiodipropionate (trade name: Sumilizer TPS),
pentaerythritol tetrakis(3-laurylthiopropionate) (trade name: Sumilizer TP-D),
ditridecyl 3,3'-thiodipropionate (trade name: Sumilizer TL),
2-mercaptobenzimidazole (trade name: Sumilizer MB),
ditridecyl 3,3'-thiodipropionate (trade name: Adeka Stab AO-503A),
1,3,5-tris-β-stearylthiopropionyloxyethyl isocyanurate,
didodecyl 3,3'-thiodipropionate (trade name: IRGANOX PS 800FL),
dioctadecyl 3,3'-thiodipropionate (trade name: IRGANOX PS 802FL), etc.

Of the foregoing antioxidants, hindered phenol compounds are especially preferred for compatibility with the resin (A) and a solvent for a resin film-forming composition. Typical of the hindered phenol compound are 1,1,3-tris(2-methyl-4-hydroxy-5-t-butylphenyl)butane, octadecyl-3-(3,5-di-t-butyl-4-hydroxyphenyl)propionate, isooctyl-3-(3,5-di-t-butyl-4-hydroxyphenyl)propionate, and 4,6-bis(octylthiomethyl)-o-cresol.

An appropriate amount of component (F) added is 0 to 5 parts by weight, and when used, preferably 0.1 to 5 parts, more preferably 0.2 to 3 parts by weight per 100 parts by weight of the resin (A). As long as the amount of component (F) is in the range, the desired effect is exerted and compatibility is ensured.

(G) Filler

The resin film or resin composition may further comprise (G) a filler. It may be any of well-known inorganic fillers, for example, metal oxides, metal nitrides, metal hydroxides, and ferrites.

Suitable metal oxides include zinc oxide, aluminum oxide, magnesium oxide, silicon oxide, beryllium oxide, copper oxide and copper suboxide. Suitable metal nitrides include boron nitride, aluminum nitride and silicon nitride. Suitable metal hydroxides include magnesium hydroxide, calcium hydroxide, and aluminum hydroxide. A typical ferrite is soft magnetic ferrite. Also included are diatomaceous earth, basic magnesium silicate, calcined clay, finely divided silica, ground quartz, crystalline silica, kaolin, talc, antimony trioxide, finely divided mica, molybdenum disulfide, rock wool, inorganic fibers (e.g., ceramic fibers, asbestos), and glass fillers (e.g., fiber glass, glass powder, glass cloth, fused silica).

The inorganic filler may have any of various shapes, for example, particles, micro-particles, nano-particles, agglomerates, composite particles of large particles and fine particles, tube, nanotube, wire, rod, needle, plate, irregular, rugby ball, hexahedron, and liquid. The inorganic filler may be either natural or synthetic, and may be used alone or in admixture.

Preferably the inorganic filler has an average particle size of 0.1 to 500 μm, more preferably 0.2 to 300 μm, and even more preferably 0.5 to 50 μm, as a median diameter measured by the laser light diffraction method.

The inorganic filler may have been surface treated with a surface treating agent. The surface treating agent is not particularly limited and may be selected from well-known agents. Suitable agents include silane coupling agents and titanate coupling agents.

Component (G) is preferably added in an amount of 0 to 50% by weight, and when used, in an amount of 5 to 50%, more preferably 10 to 30%, even more preferably 15 to 20% by weight, based on the surface protective film. As long as the amount of component (G) is in the range, the cured film is free of a substantial drop of strength and eliminates the problem that the film is broken upon stripping to leave any resin or additive residues on the substrate.

Other Components

The resin film or resin composition may further comprise another polymer as long as the film is bondable to the substrate, maintains heat resistance and pressure resistance, and smoothly strippable at the end of service. Suitable other polymers include epoxy resins, polyolefin resins, bismaleimide resins, polyimide resins, polyether resins, phenolic resins, silicone resins, polycarbonate resins, polyamide resins, polyester resins, fluoro-resins, acrylic resins, melamine resins, urea resins, and urethane resins. When used, the other resin is preferably added in an amount of 0 to 1,000 parts by weight per 100 parts by weight of the silphenylene-siloxane skeleton-containing resin (A).

The resin film or resin composition may further comprise other additives, for example, reinforcements, thickeners, stabilizers, flameproofing agents, pigments, colorants, and adjuvants. The other additive is preferably added in an amount of 0 to 40 parts by weight per 100 parts by weight of the silphenylene-siloxane skeleton-containing resin (A).

Base Film

The base film included in the surface protective film is a film for supporting the resin film. It is preferably formed of a polyester, polyimide, polyamide, polyamide-imide, polyetherimide, triacetate cellulose, polyethersulfone or polyphenylene sulfide. The base film may be a laminate of two or more film layers.

Suitable polyesters include polyethylene terephthalate (PET), polybutylene terephthalate (PBT), and polyethylene naphthalate (PEN).

Although the thickness of the base film is not particularly limited, the thickness is preferably 10 to 500 μm, more preferably 35 to 200 μm. As long as the thickness is in the range, the base film has a necessary minimum rigidity, a sufficient flexibility to apply the surface protective film, and ease of working.

The thickness of the surface protective film, that is, the total thickness of base film and resin film is preferably 30 to 800 μm, more preferably 50 to 500 μm, and even more preferably 100 to 300 μm. A surface protective film having a thickness of at least 30 μm is sufficient to bury irregularities on the substrate, and a surface protective film having a thickness of up to 800 μm provides sufficient heat conduction and visibility of alignment marks.

Preparation of Surface Protective Film

Another embodiment of the invention is a method for preparing a surface protective film, comprising the steps of applying a surface protective resin composition onto the base film and heat curing the composition into a resin film, thus obtaining the surface protective film having the resin film on the base film.

The surface protective resin composition is obtained by dissolving components (A) to (D) and optional components in a solvent. The solvent used to formulate the film-forming resin composition is not particularly limited as long as organic components are soluble therein. However, a solvent having an extremely low boiling point will evaporate during preparation of the composition, adversely affecting the film thickness, whereas a solvent having an extremely high boiling point will interfere with film formation. For this reason, it is recommended to use solvents having a boiling point of 60 to 180° C., more preferably 80 to 140° C. Suitable solvents include decane, toluene, xylene, tetrahydrofuran, cyclopentanone, ethyl acetate, and isopropyl alcohol, but are not limited thereto.

Although the amount of the solvent used is not particularly limited, the solvent is preferably used in such amounts that the surface protective resin composition may have a solids concentration of 50 to 80% by weight.

The surface protective resin composition may be prepared by various methods. In one method using a mixer/shaker, necessary components are fed in a container where they are agitated by the shaker at 500 to 4,000 rpm for 5 to 30 minutes. In another method using a mixer, necessary components are mixed and dissolved in a solvent. In a further method using an impeller, all components are fed in a container where they are stirred by the impeller, or steps of feeding and stirring some components or divided portions in a container are repeated in sequence.

Substrate Processing Laminate

A further embodiment of the invention is a substrate processing laminate comprising a substrate and the surface protective film disposed on at least one surface of the substrate. The substrate processing laminate may be prepared, for example, by attaching the surface protective film to at least one surface of the substrate. Once the surface protective film is attached to the surface of the substrate, the film-bearing surface of the substrate is protected. When the other surface of the substrate (opposite to the film-bearing surface) is precision machined or the laminate is moved or handled, such operation can be carried out without causing damage or contamination to the film-bearing substrate surface. At the end of operation, or if protection is no longer necessary, then the surface protective film can be physically smoothly stripped. After stripping, no or little resin and other residues are left on the substrate surface. As a result, significant improvements in operation efficiency and production yield are achieved.

Examples of the substrate used herein include silicon base substrates such as silicon wafers, silicon nitride substrates, and silicon oxide substrates; glass substrates such as glass wafers and quartz substrates; plastic substrates such as phenolic paper, glass epoxy and polyimide substrates; printed circuit boards, and organic substrates having a wiring or electrode circuit thereon.

In attaching the surface protective film to the substrate, any desired tool may be used, for example, a vacuum laminator, pressure type vacuum laminator, tape bonder or vacuum tape bonder. It is recommended to preheat the substrate prior to the attachment for the reason that when the surface protective film is contacted with the substrate, the resin film is softened and tightly contacted to the substrate surface. Once the surface protective film is attached to the substrate surface (to be protected), the resin film is heat cured. The heat curing temperature, which varies depending on the type and amount of the catalyst, is preferably selected in a range of 60 to 220° C., more preferably 100 to 210° C., and even more preferably 150 to 190° C. A temperature of at least 60° C. eliminates problems such as a long curing time and undercure whereas a temperature of up to 220° C. does not adversely affect the physical properties of the resin composition and the circuit on the substrate. The curing time, which varies depending on the type and amount of the catalyst, is preferably selected in a range of 0.25 to 10 hours, more preferably 0.5 to 6 hours, and even more preferably 1 to 3 hours. A time of at least 0.25 hour is sufficient for the resin composition to cure fully whereas a time of up to 10 hours provides acceptable throughputs.

Now that the substrate is protected with the surface protective film of the invention, during precision processing such as circuit formation or TSV formation and ordinary handling such as transportation, the film serves to prevent any damages and contamination to the circuit or through-holes on the substrate surface and the substrate surface itself. As used herein, the term "precision processing" encompasses circuit formation, TSV formation, stacking, spin coating, plating, dry etching, plasma treatment, and the like; and the term "ordinary handling" encompasses feed, transportation, temporary storage, and the like.

When the surface protective film is stripped from the substrate processing laminate, physical means may be used. For example, a blade is inserted between the film and the substrate, and the film is separated from the substrate, utilizing the blade edge as the starting point. Then the film is stripped from the laminate without leaving residues or contaminants on the substrate surface.

EXAMPLE

Examples of the invention are given below by way of illustration and not by way of limitation. Mw of a resin is measured versus polystyrene standards by GPC using tetrahydrofuran solvent. The composition of a resin is analyzed by $^{1}$H-NMR spectroscopy.

Starting Compounds S-1 to S-7 used in Examples are identified below.

(S-1)

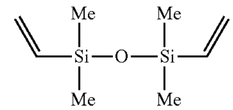

(S-2)

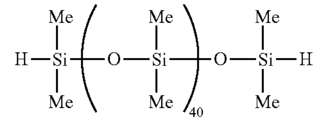

(S-3)

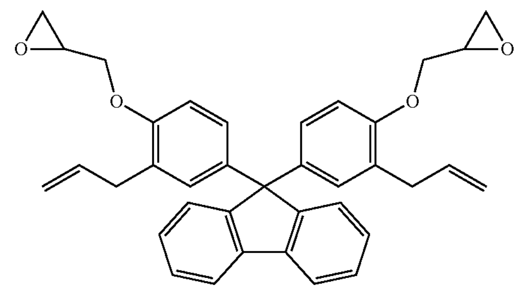

(S-4)

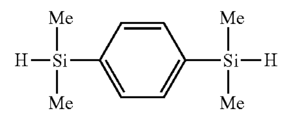

(S-5)

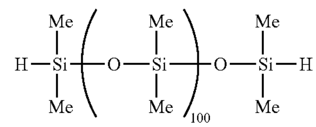

(S-6)

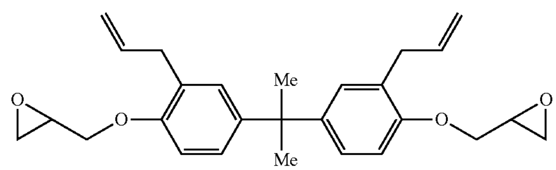

(S-7)

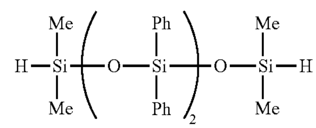

Synthesis Example 1

In a 3-L flask equipped with a stirrer, thermometer, nitrogen purge line and reflux condenser, 14.3 g of Compound S-1, 477.0 g of Compound S-2, and 167.0 g of Compound S-3 were dissolved in 2,000 g of toluene and heated at 60° C. Then 2.0 g of a catalyst (5 wt % platinum on carbon) was admitted into the flask. It was confirmed that the internal temperature rose to 65-67° C., after which the reaction mixture was heated at 90° C., stirred at the temperature for 3 hours, and cooled to 60° C. again. To the flask, 2.0 g of the catalyst (5 wt % platinum on carbon) was admitted, and 44.9 g of Compound S-4 was added dropwise over 0.5 hour. In the course, the internal temperature rose to 68° C. At the end of dropwise addition, the reaction solution was aged at 90° C. for 3 hours. After cooling to room temperature, 700 g of methyl isobutyl ketone (MIBK) was added to the reaction solution, which was passed through a filter under pressure to remove the platinum catalyst. The polymer solution thus obtained was combined with 600 g of deionized water, stirred, and allowed to stand for stationary separation, after which the lower layer or water layer was removed. This separatory and water washing procedure was repeated 6 times whereby the trace acid ingredient was removed from the polymer solution. From the polymer solution, the solvent was distilled off in vacuum. Finally, 378 g of cyclopentanone was added to the residue, obtaining a solution of Resin A in cyclopentanone having a solids concentration of 65 wt %. Resin A had a Mw of 53,000.

Resin A

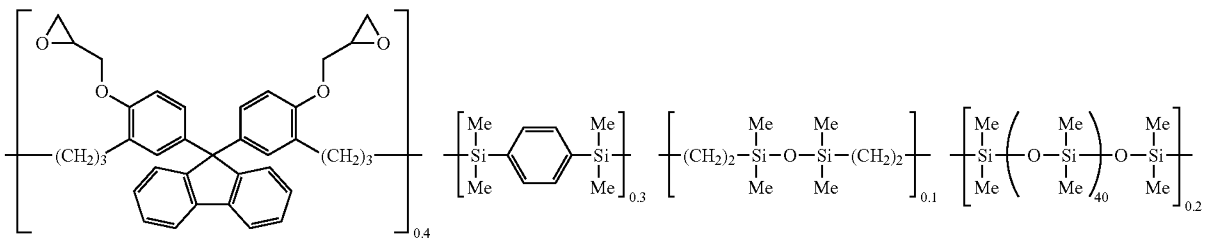

Synthesis Example 2

In a similar 3-L flask, 108.5 g of Compound S-3 and 603.9 g of Compound S-5 were dissolved in 2,040 g of toluene and heated at 60° C. Then 2.0 g of a catalyst (5 wt % platinum on carbon) was admitted into the flask. It was confirmed that the internal temperature rose to 65-67° C., after which the reaction mixture was heated at 90° C., stirred at the temperature for 3 hours, and cooled to 60° C. again. To the flask, 2.0 g of the catalyst (5 wt % platinum on carbon) was admitted, and 23.3 g of Compound S-4 was added dropwise over 0.5 hour. In the course, the internal temperature rose to 75° C. At the end of dropwise addition, the reaction solution was aged at 90° C. for 3 hours. After cooling to room temperature, 700 g of MIBK was added to the reaction solution, which was passed through a filter under pressure to remove the catalyst. The polymer solution thus obtained was combined with 600 g of deionized water, stirred, and allowed to stand for stationary separation, after which the lower layer or water layer was removed. This separatory and water washing procedure was repeated 6 times whereby the trace acid ingredient was removed from the polymer solution. From the polymer solution, the solvent was distilled off in vacuum. Finally, 396 g of cyclopentanone was added to the residue, obtaining a cyclopentanone solution of Resin B having a solids concentration of 65 wt %. Resin B had a Mw of 53,900.

Synthesis Example 3

In a similar 3-L flask, 86.8 g of Compound S-3, 603.9 g of Compound S-5, and 7.5 g of Compound S-1 were dissolved in 1,950 g of toluene and heated at 60° C. Then 2.0 g of a catalyst (5 wt % platinum on carbon) was admitted into the flask. It was confirmed that the internal temperature rose to 65-67° C., after which the reaction mixture was heated at 90° C., stirred at the temperature for 3 hours, and cooled to 60° C. again. To the flask, 2.0 g of the catalyst (5 wt % platinum on carbon) was admitted, and 23.3 g of Compound S-4 was added dropwise over 0.5 hour. In the course, the internal temperature rose to 72° C. At the end of dropwise addition, the reaction solution was aged at 90° C. for 3 hours. After cooling to room temperature, 700 g of MIBK was added to the reaction solution, which was passed through a filter under pressure to remove the catalyst. The polymer solution thus obtained was combined with 600 g of deionized water, stirred, and allowed to stand for stationary separation, after which the lower layer or water layer was removed. This separatory and water washing procedure was repeated 6 times whereby the trace acid ingredient was removed from the polymer solution. From the polymer solution, the solvent was distilled off in vacuum. Finally, 388 g of cyclopentanone was added to the residue, obtaining a cyclopentanone solution of Resin C having a solids concentration of 65 wt %. Resin C had a Mw of 62,200.

Resin B

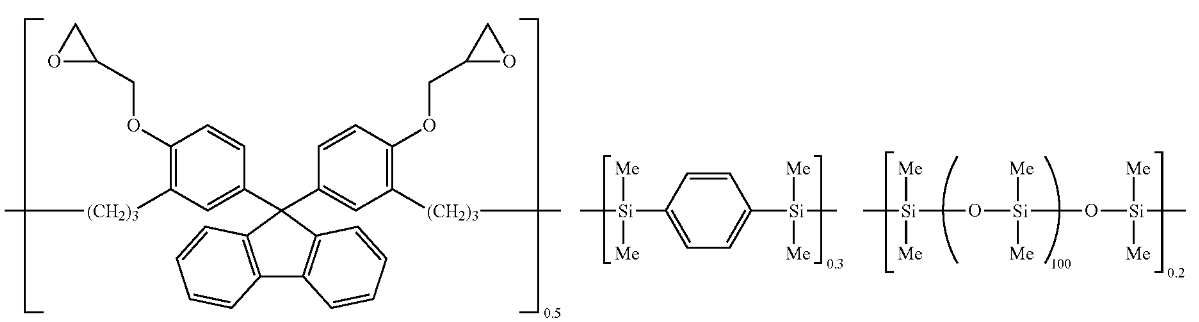

Resin C

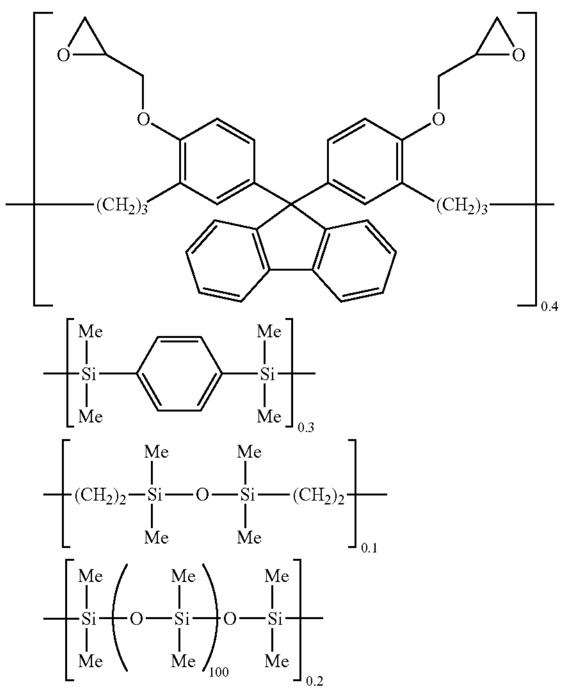

Resin D

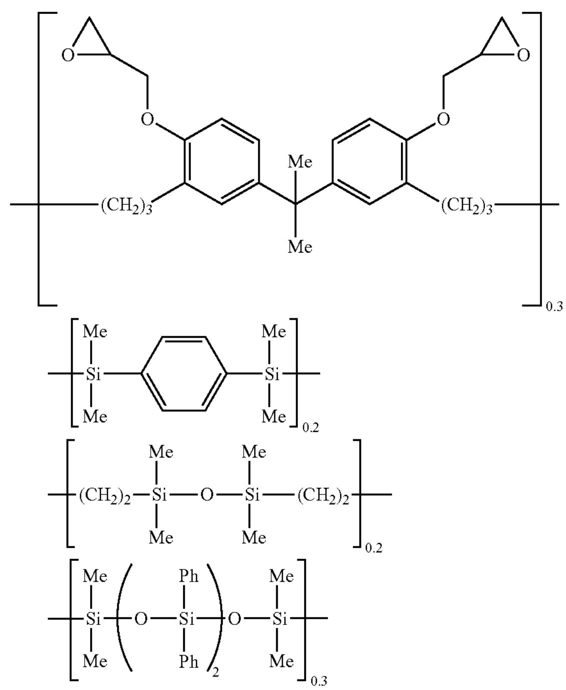

Synthesis Example 4

In a similar 3-L flask, 252.3 g of Compound S-6, 318.5 g of Compound S-7, and 74.6 g of Compound S-1 were dissolved in 1,950 g of toluene and heated at 60° C. Then 2.0 g of a catalyst (5 wt % platinum on carbon) was admitted into the flask. It was confirmed that the internal temperature rose to 65-67° C., after which the reaction mixture was heated at 90° C., stirred at the temperature for 3 hours, and cooled to 60° C. again. To the flask, 2.0 g of the catalyst (5 wt % platinum on carbon) was admitted, and 77.8 g of Compound S-4 was added dropwise over 0.5 hour. In the course, the internal temperature rose to 70° C. At the end of dropwise addition, the reaction solution was aged at 90° C. for 3 hours. After cooling to room temperature, 700 g of MIBK was added to the reaction solution, which was passed through a filter under pressure to remove the catalyst. The polymer solution thus obtained was combined with 600 g of deionized water, stirred, and allowed to stand for stationary separation, after which the lower layer or water layer was removed. This separatory and water washing procedure was repeated 6 times whereby the trace acid ingredient was removed from the polymer solution. From the polymer solution, the solvent was distilled off in vacuum. Finally, 389 g of cyclopentanone was added to the residue, obtaining a cyclopentanone solution of Resin D having a solids concentration of 65 wt %. Resin D had a Mw of 32,000.

Synthesis Example 5

In a 3-L flask equipped with a stirrer, thermometer, nitrogen purge line and reflux condenser, 210.3 g of Compound S-6, 414.1 g of Compound S-7, and 37.3 g of Compound S-1 were dissolved in 2,000 g of toluene and heated at 60° C. Then 2.0 g of a catalyst (5 wt % platinum on carbon) was admitted into the flask. It was confirmed that the internal temperature rose to 65-67° C., after which the reaction mixture was heated at 90° C., stirred at the temperature for 3 hours, and cooled to 60° C. again. To the flask, 2.0 g of the catalyst (5 wt % platinum on carbon) was admitted, and 101.1 g of Compound S-4 was added dropwise over 0.5 hour. In the course, the internal temperature rose to 70° C. At the end of dropwise addition, the reaction solution was aged at 90° C. for 3 hours. After cooling to room temperature, 700 g of MIBK was added to the reaction solution, which was passed through a filter under pressure to remove the platinum catalyst. The polymer solution thus obtained was combined with 600 g of deionized water, stirred, and allowed to stand for stationary separation, after which the lower layer or water layer was removed. This separatory and water washing procedure was repeated 6 times whereby the trace acid ingredient was removed from the polymer solution. From the polymer solution, the solvent was distilled off in vacuum. Finally, 410 g of cyclopentanone was added to the residue, obtaining a solution of Resin E in cyclopentanone having a solids concentration of 65 wt %. Resin E had a Mw of 25,000.

Resin E

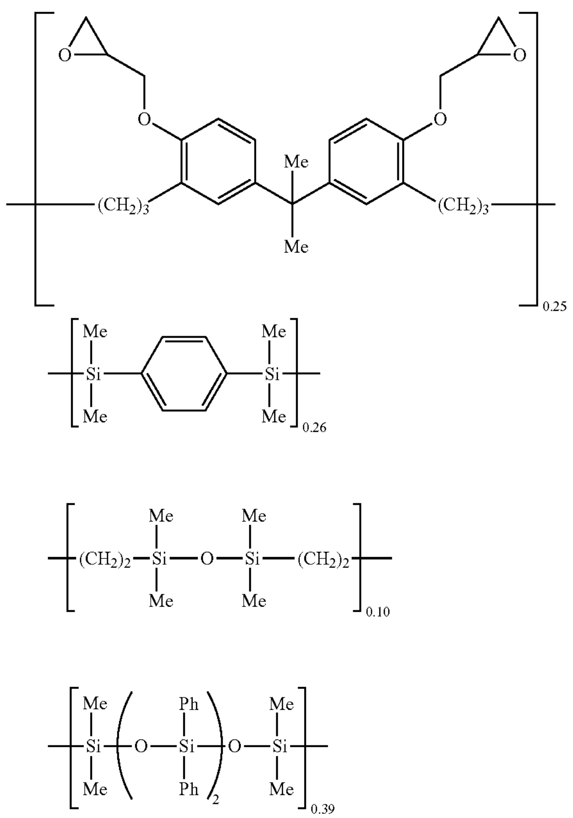

Comparative Synthesis Example 1

In a similar 3-L flask, 27.1 g of Compound S-3, 629.1 g of Compound S-5, and 6.2 g of Compound S-6 were dissolved in 1,950 g of toluene and heated at 60° C. Then 4.0 g of a catalyst (5 wt % platinum on carbon) was admitted into the flask. It was confirmed that the internal temperature rose to 65-67° C., after which the reaction mixture was heated at 90° C. and stirred at the temperature for 6 hours. After cooling to room temperature, 700 g of MIBK was added to the reaction solution, which was passed through a filter under pressure to remove the catalyst. The polymer solution thus obtained was combined with 600 g of deionized water, stirred, and allowed to stand for stationary separation, after which the lower layer or water layer was removed. This separatory and water washing procedure was repeated 6 times whereby the trace acid ingredient was removed from the polymer solution. From the polymer solution, the solvent was distilled off in vacuum. Finally, 356 g of cyclopentanone was added to the residue, obtaining a cyclopentanone solution of Resin F having a solids concentration of 65 wt %. Resin F had a Mw of 50,100.

Resin F

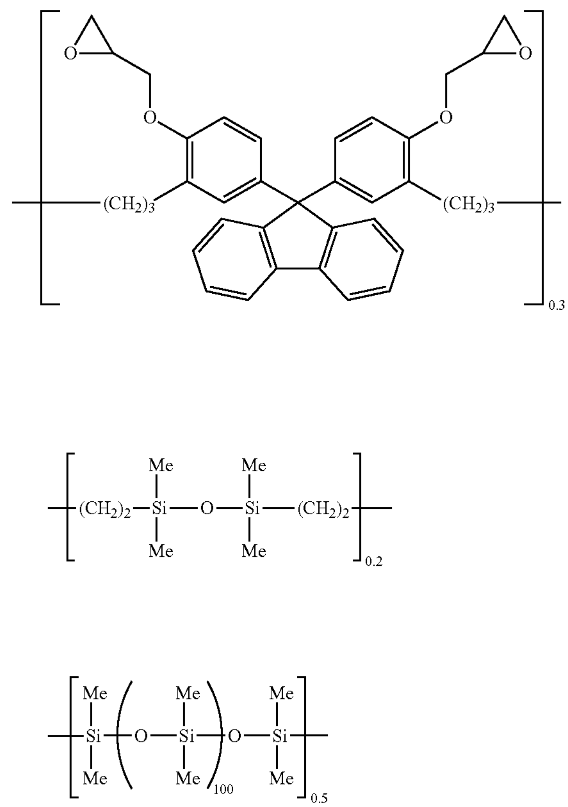

Comparative Synthesis Example 2

In a similar 3-L flask, 542.7 g of Compound S-3 was dissolved in 1,850 g of toluene and heated at 60° C. To the flask, 4.0 g of a catalyst (5 wt % platinum on carbon) was admitted and 194.4 g of Compound S-4 was added dropwise. It was confirmed that the internal temperature rose to 65-67° C., after which the reaction mixture was heated at 90° C. and stirred at the temperature for 3 hours. After cooling to room temperature, 700 g of MIBK was added to the reaction solution, which was passed through a filter under pressure to remove the catalyst. The polymer solution thus obtained was combined with 600 g of deionized water, stirred, and allowed to stand for stationary separation, after which the lower layer or water layer was removed. This separatory and water washing procedure was repeated 6 times whereby the trace acid ingredient was removed from the polymer solution. From the polymer solution, the solvent was distilled off in vacuum. Finally, 397 g of cyclopentanone was added to the residue, obtaining a cyclopentanone solution of Resin G having a solids concentration of 65 wt %. Resin G had a Mw of 48,000.

Resin G

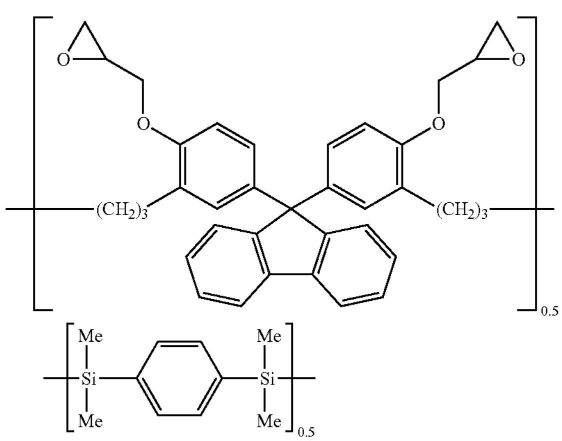

Comparative Synthesis Example 3

In a similar 3-L flask, 168.2 g of Compound S-6, 446.0 g of Compound S-7, and 37.3 g of Compound S-1 were dissolved in 2,000 g of toluene and heated at 60° C. To the flask, 2.0 g of a catalyst (5 wt % platinum on carbon) was admitted. It was confirmed that the internal temperature rose to 65-67° C., after which the reaction mixture was heated at 90° C., stirred at the temperature for 3 hours, and cooled to 60° C. again. To the flask, 2.0 g of the catalyst (5 wt % platinum on carbon) was admitted, and 108.9 g of Compound S-4 was added dropwise over 0.5 hour. In the course, the internal temperature rose to 70° C. At the end of dropwise addition, the reaction solution was aged at 90° C. for 3 hours. After cooling to room temperature, 700 g of MIBK was added to the reaction solution, which was passed through a filter under pressure to remove the catalyst. The polymer solution thus obtained was combined with 600 g of deionized water, stirred, and allowed to stand for stationary separation, after which the lower layer or water layer was removed. This separatory and water washing procedure was repeated 6 times whereby the trace acid ingredient was removed from the polymer solution. From the polymer solution, the solvent was distilled off in vacuum. Finally, 410 g of cyclopentanone was added to the residue, obtaining a cyclopentanone solution of Resin H having a solids concentration of 65 wt %. Resin H had a Mw of 12,100.

Resin H

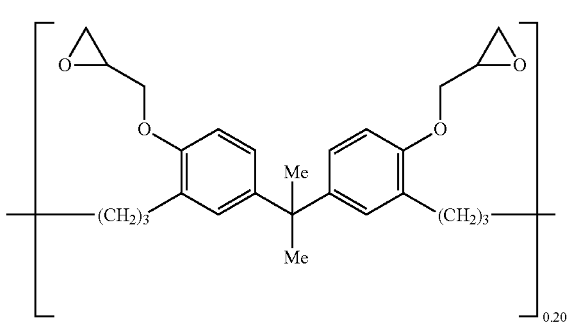

-continued

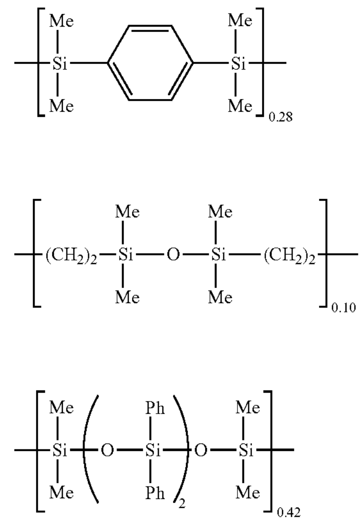

Examples 1 to 10 and Comparative Examples 1 to 6

Preparation of Surface Protective Film

To 100 g of the resin in each resin solution, a trifunctional phenol compound having formula (S-8) (TrisP-PA by Honshu Chemical Industry Co., Ltd.) as component (B) was added in an amount equivalent to the epoxy group in the resin. To the solution were added 0.5 g of 2-phenyl-4-methyl-5-hydroxymethyl imidazole (Shikoku Chemicals Corp.) as component (C), 0.5 g of an antioxidant (Chimassorb 944 by Ciba Specialty Chemicals), a parting agent shown in Table 1 as component (D), and silica as component (G). The solution was coated onto a polyimide (PI) sheet of 50 μm thick by means of a blade knife, and heated in a dryer at 100° C. for 10 minutes, forming a resin film of 90 μm thick on the PI sheet. The thickness of the resin film was measured by a probe type thickness gauge.

(S-8)

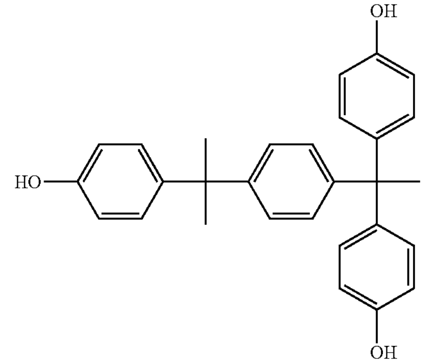

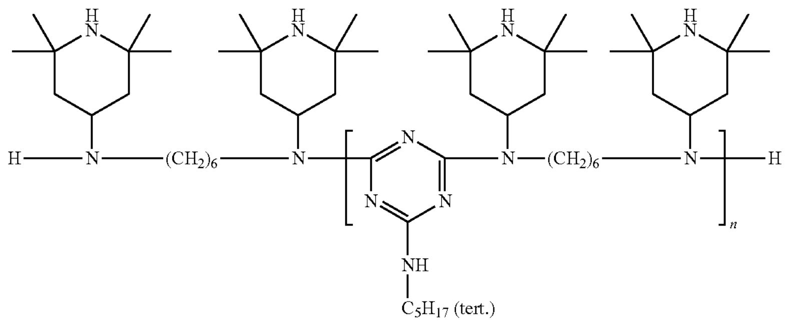

Chimassorb 944

Mn = 2,000 to 3,100 g/mol

TABLE 1

| | | Example | | | | | | | | | | Comparative Example | | | | | |
|---|---|---|---|---|---|---|---|---|---|---|---|---|---|---|---|---|---|
| | | 1 | 2 | 3 | 4 | 5 | 6 | 7 | 8 | 9 | 10 | 1 | 2 | 3 | 4 | 5 | 6 |
| Resin | | A | A | A | B | C | C | C | D | D | E | A | A | A | F | G | H |
| Silphenylene | | incl. | incl. | incl. | incl. | incl. | incl. | incl. | incl. | incl. | incl. | incl. | incl. | incl. | excl. | incl. | incl. |
| Siloxane | | incl. | incl. | incl. | incl. | incl. | incl. | incl. | incl. | incl. | incl. | incl. | incl. | incl. | incl. | excl. | incl. |
| Parting agent | KF-54 | 5 g | 0.5 g | 20 g | 5 g | 5 g | — | — | 5 g | 5 g | 5 g | — | 0.1 g | 25 g | 5 g | 5 g | 5 g |
| | Hi-wax | — | — | — | — | — | 5 g | — | — | — | — | — | — | — | — | — | — |
| | Cheminox FA-4 | — | — | — | — | — | — | 5 g | — | — | — | — | — | — | — | — | — |
| Filler | silica | — | — | — | — | — | — | — | — | 22 g | — | — | — | — | — | — | — |

In Table 1, the parting agent KF-54 is methylphenylpolysiloxane having a viscosity of 450 cSt at 25° C. (Shin-Etsu Chemical Co., Ltd.), Hi-wax is a low molecular weight polyolefin (Mitsui Chemicals, Inc.), and Cheminox FA-4 is 2-(perfluorobutyl)ethanol (Unimatec Co., Ltd.). The filler is silica having an average particle size of 5.0 μm (Admatechs Co.).

Lamination

Using a vacuum laminator (TEAM-100 by Takatori Corp.), the surface protective film was attached to a silicon wafer or glass wafer at 120° C. Using a tape bonder, the surface protective film was attached to an organic substrate (glass-epoxy substrate) at 120° C. In all cases, the film on the substrate was heated in nitrogen atmosphere at 180° C. for 4 hours whereby the resin composition was cured before the following tests were carried out.

It is noted that the silicon wafer was a 200 mm silicon wafer of 725 μm thick having copper posts of 10 μm height and 40 μm diameter distributed over the entire surface. The glass wafer was a 200 mm glass wafer having an unprocessed surface. The organic substrate was a glass-epoxy substrate of 15 cm squares coated on one surface with a solder resist.

Bond Test

After the surface protective film bonded to the silicon wafer, glass wafer or organic substrate was heat cured, it was cooled and visually inspected for the interfacial bond state. The sample was rated poor (x) when bubbles and faults were detected at the interface and good (○) for no faults.

Heat Resistance Test

After the surface protective film bonded to the silicon wafer was heat cured, it was rested on a hot plate at 200° C. or 260° C. for 10 minutes. It was cooled to room temperature and visually inspected for the interfacial bond state. The sample was rated poor (x) when bubbles and faults were detected at the interface and good (○) for no faults.

Pressure Resistance Test

After the surface protective film bonded to the silicon wafer was heat cured, heat and pressure were applied to the film to examine whether or not the resin film was largely deformed thereby. For heat and pressure application, a wafer bonder EVG520IS (EVG) was operated at a temperature of 160° C., a chamber internal pressure of $10^{-3}$ mbar, and a load of 5 kN. The sample was cooled to room temperature and visually inspected for the interfacial bond state. The sample was rated poor (x) when bubbles and faults were detected at the interface and the resin was squeezed to the wafer side edge and good (○) for neither faults nor outside squeeze.

Stripping Test

The laminate having the (cured) surface protective film bonded to the silicon wafer, glass wafer or organic substrate was set on a chuck plate by vacuum suction. The surface protective film was stripped at room temperature by picking up the film with tweezers and lifting the tweezers. The sample was rated good (○) when the film could be stripped without leaving resin residues or marks on the substrate surface and poor (x) when resin residues or marks were left on the substrate surface, the film could not be stripped, or the film was broken during stripping because of an extra stripping force.

Long-Term Storage Test

After the surface protective film bonded to the silicon wafer was heat cured, the laminate was allowed to cool down and stored at room temperature for 15 days or 30 days.

It was visually inspected for the interfacial state between the film and the substrate. The sample was rated good (○) when the state was unchanged before and after the storage and poor (x) for any changes.

The laminate after 15 days or 30 days of storage was set on a chuck plate by vacuum suction. The surface protective film was stripped at room temperature by picking up the film with tweezers and lifting the tweezers. The sample was rated good (○) when the film could be stripped without leaving resin residues or marks on the substrate surface and poor (x) when resin residues or marks were left on the substrate surface, the film could not be stripped, or the film was broken during stripping because of an extra stripping force.

Table 2 shows the test results of the surface protective film on the silicon wafer. Table 3 shows the test results of the surface protective film on the glass wafer. Table 4 shows the test results of the surface protective film on the organic substrate.

TABLE 2

| | | Example | | | | | | | | | | Comparative Example | | | | | |
|---|---|---|---|---|---|---|---|---|---|---|---|---|---|---|---|---|---|
| | | 1 | 2 | 3 | 4 | 5 | 6 | 7 | 8 | 9 | 10 | 1 | 2 | 3 | 4 | 5 | 6 |
| Bond test | | ○ | ○ | ○ | ○ | ○ | ○ | ○ | ○ | ○ | ○ | ○ | ○ | ○ | ○ | x | ○ |
| Heat resistance test | @200° C. | ○ | ○ | ○ | ○ | ○ | ○ | ○ | ○ | ○ | ○ | ○ | ○ | x | ○ | — | x |
| | @260° C. | ○ | ○ | ○ | ○ | ○ | ○ | ○ | ○ | ○ | ○ | x | x | x | ○ | — | x |
| Pressure resistance test | | ○ | ○ | ○ | ○ | ○ | ○ | ○ | ○ | ○ | ○ | ○ | ○ | ○ | x | — | x |
| Stripping test | | ○ | ○ | ○ | ○ | ○ | ○ | ○ | ○ | ○ | ○ | x | x | x | x | — | x |
| Long-term storage test, 15 days | Appearance | ○ | ○ | ○ | ○ | ○ | ○ | ○ | ○ | ○ | ○ | ○ | ○ | ○ | ○ | x | ○ |
| | Stripping test | ○ | ○ | ○ | ○ | ○ | ○ | ○ | ○ | ○ | ○ | x | x | x | x | — | x |
| Long-term storage test, 30 days | Appearance | ○ | ○ | ○ | ○ | ○ | ○ | ○ | ○ | ○ | ○ | ○ | ○ | ○ | ○ | x | ○ |
| | Stripping test | ○ | ○ | ○ | ○ | ○ | ○ | ○ | ○ | ○ | ○ | x | x | x | x | — | x |

TABLE 3

| | | Example | | | | | | | | | | Comparative Example | | | | | |
|---|---|---|---|---|---|---|---|---|---|---|---|---|---|---|---|---|---|
| | | 1 | 2 | 3 | 4 | 5 | 6 | 7 | 8 | 9 | 10 | 1 | 2 | 3 | 4 | 5 | 6 |
| Bond test | | ○ | ○ | ○ | ○ | ○ | ○ | ○ | ○ | ○ | ○ | ○ | ○ | ○ | ○ | x | ○ |
| Stripping test | | ○ | ○ | ○ | ○ | ○ | ○ | ○ | ○ | ○ | ○ | x | x | x | x | — | x |
| Long-term storage test, 15 days | Appearance | ○ | ○ | ○ | ○ | ○ | ○ | ○ | ○ | ○ | ○ | ○ | ○ | ○ | x | x | ○ |
| | Stripping test | ○ | ○ | ○ | ○ | ○ | ○ | ○ | ○ | ○ | ○ | x | x | x | — | — | x |
| Long-term storage test, 30 days | Appearance | ○ | ○ | ○ | ○ | ○ | ○ | ○ | ○ | ○ | ○ | ○ | ○ | ○ | x | x | ○ |
| | Stripping test | ○ | ○ | ○ | ○ | ○ | ○ | ○ | ○ | ○ | ○ | x | x | x | — | — | x |

TABLE 4

| | | Example | | | | | | | | | | Comparative Example | | | | | |
|---|---|---|---|---|---|---|---|---|---|---|---|---|---|---|---|---|---|
| | | 1 | 2 | 3 | 4 | 5 | 6 | 7 | 8 | 9 | 10 | 1 | 2 | 3 | 4 | 5 | 6 |
| Bond test | | ○ | ○ | ○ | ○ | ○ | ○ | ○ | ○ | ○ | ○ | ○ | ○ | ○ | ○ | x | ○ |
| Stripping test | | ○ | ○ | ○ | ○ | ○ | ○ | ○ | ○ | ○ | ○ | x | x | x | x | — | x |
| Long-term storage test, 15 days | Appearance | ○ | ○ | ○ | ○ | ○ | ○ | ○ | ○ | ○ | ○ | ○ | ○ | ○ | x | x | ○ |
| | Stripping test | ○ | ○ | ○ | ○ | ○ | ○ | ○ | ○ | ○ | ○ | x | x | x | — | — | x |
| Long-term storage test, 30 days | Appearance | ○ | ○ | ○ | ○ | ○ | ○ | ○ | ○ | ○ | ○ | ○ | ○ | ○ | x | x | ○ |
| | Stripping test | ○ | ○ | ○ | ○ | ○ | ○ | ○ | ○ | ○ | ○ | x | x | x | — | — | x |

As is evident from the data, the surface protective film of the invention is satisfactory in useful properties such as bond, release ability and pressure resistance, maintains release ability even after long-term storage, and protects the substrate surface during processing and handling of the substrate. At the end of processing or when the surface protective film ceases its service, the surface protective film can be stripped physically smoothly without a need for any special or expensive equipment like UV irradiation equipment, and without leaving any resin residues or marks on the substrate surface.

It is noted that the invention is not limited to the aforementioned embodiments. While the embodiments are merely exemplary, any embodiments having substantially the same construction as the technical concept set forth in the following claims and exerting equivalent functions and results are believed to be within the spirit and scope of the invention.

Japanese Patent Application No. 2016-019725 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A surface protective film comprising a base film and a resin film formed thereon, said resin film being formed of a resin composition comprising components (A) to (D):

(A) a silphenylene-siloxane skeleton-containing resin represented by the formula (1) and having a weight average molecular weight of 10,000 to 100,000, (B) a compound capable of reacting with an epoxy group in the silphenylene-siloxane skeleton-containing resin to form a crosslinked structure, (C) a curing catalyst, and (D) a parting agent selected from the group consisting of polyethylenes, silicone compounds, fluorine compounds, fatty acids, and fatty acid esters, in an amount of 0.5 to 20 parts by weight per 100 parts by weight of component (A), (1)

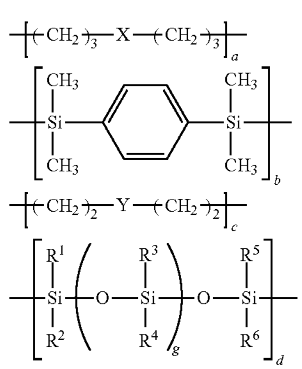

wherein $R^1$ to $R^6$ are each independently a $C_1$-$C_{20}$ monovalent hydrocarbon group or alkoxy group, a, b, c, and d, indicative of compositional ratios of corresponding repeating units, are positive numbers satisfying: 0<a<1, 0<b<1, 0<c<1, 0<d<1, 0.35≤a+c≤0.65, 0.35≤b+d≤0.65, and a+b+c+d=1, g is an integer of 0 to 300, X is a divalent organic group having the formula (2):

(2)

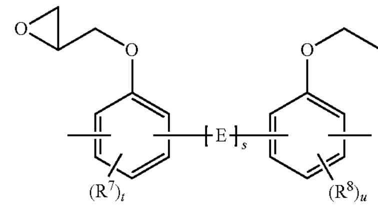

wherein E is a divalent organic group selected from the following:

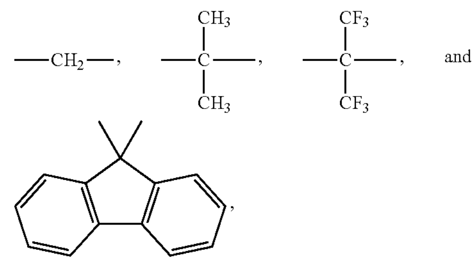

s is 0 or 1, $R^7$ and $R^8$ are each independently a $C_1$-$C_{20}$ monovalent hydrocarbon group or alkoxy group, t and u are each independently an integer of 0 to 2, and Y is a divalent siloxane chain having the formula (3):

(3)

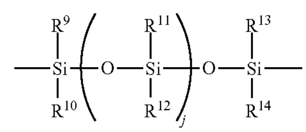

wherein $R^9$ to $R^{14}$ are each independently a $C_1$-$C_{20}$ monovalent hydrocarbon group or alkoxy group, and j is an integer of 0 to 300.

2. The surface protective film of claim 1 wherein in formula (1), a+c=0.5 and b+d=0.5.

3. The surface protective film of claim 1 wherein the resin film-forming composition further comprises at least one component of (E) a flame retardant, (F) an antioxidant, and (G) a filler.

4. The surface protective film of claim 1 wherein the base film is formed of polyester, polyimide, polyamide, polyamide-imide, polyetherimide, triacetate cellulose, polyethersulfone or polyphenylene sulfide.

5. A substrate processing laminate comprising a substrate and the surface protective film of claim 1 disposed on at least one surface of the substrate.

6. A method for preparing a surface protective film comprising a base film and a resin film formed thereon, the method comprising the steps of applying a surface protective resin composition onto the base film and heat curing the composition into the resin film, said resin composition comprising components (A) to (D):

(A) a silphenylene-siloxane skeleton-containing resin represented by the formula (1) and having a weight average molecular weight of 10,000 to 100,000, (B) a compound capable of reacting with an epoxy group in the silphenylene-siloxane skeleton-containing resin to form a crosslinked structure, (C) a curing catalyst, and (D) a parting agent selected from the group consisting of polyethylenes, silicone compounds, fluorine compounds, fatty acids, and fatty acid esters, in an amount of 0.5 to 20 parts by weight per 100 parts by weight of component (A), (1)

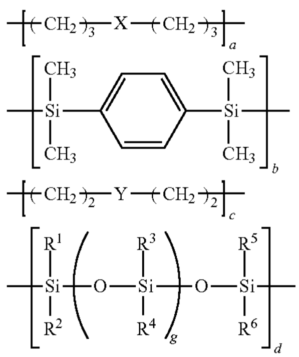

wherein $R^1$ to $R^6$ are each independently a $C_1$-$C_{20}$ monovalent hydrocarbon group or alkoxy group, a, b, c, and d, indicative of compositional ratios of corresponding repeating units, are positive numbers satisfying: $0<a<1$, $0<b<1$, $0<c<1$, $0<d<1$, $0.35\leq a+c\leq 0.65$, $0.35\leq b+d\leq 0.65$, and $a+b+c+d=1$, g is an integer of 0 to 300, X is a divalent organic group having the formula (2):

(2)

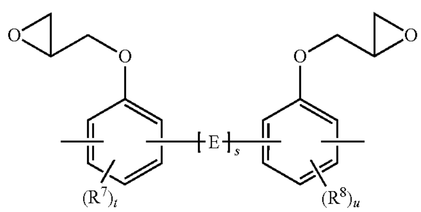

wherein E is a divalent organic group selected from the following:

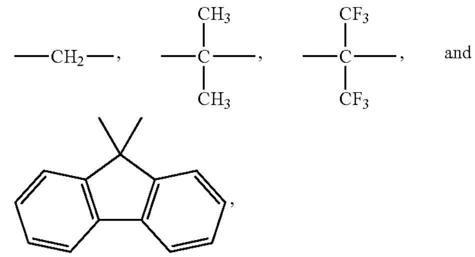

s is 0 or 1, $R^7$ and $R^8$ are each independently a $C_1$-$C_{20}$ monovalent hydrocarbon group or alkoxy group, t and u are each independently an integer of 0 to 2, and Y is a divalent siloxane chain having the formula (3):

(3)

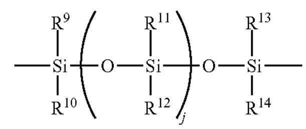

wherein $R^9$ to $R^{14}$ are each independently a $C_1$-$C_{20}$ monovalent hydrocarbon group or alkoxy group, and j is an integer of 0 to 300.

7. The method of claim 6 wherein in formula (1), $a+c=0.5$ and $b+d=0.5$.

8. The method of claim 6 wherein the surface protective resin composition further comprises at least one component of (E) a flame retardant, (F) an antioxidant, and (G) a filler.

9. The method of claim 6 wherein the base film is formed of polyester, polyimide, polyamide, polyamide-imide, polyetherimide, triacetate cellulose, polyethersulfone or polyphenylene sulfide.

10. A method for protecting a substrate having a circuit-forming surface, comprising the steps of attaching the surface protective film of claim 1 to the circuit-forming surface of the substrate, and heat curing the resin film to bond the surface protective film to the substrate.

* * * * *